(12) United States Patent
Ali

(10) Patent No.: US 6,381,272 B1
(45) Date of Patent: Apr. 30, 2002

(54) MULTI-CHANNEL ADAPTIVE FILTERING

(75) Inventor: Murtaza Ali, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/235,891

(22) Filed: Jan. 22, 1999

Related U.S. Application Data

(60) Provisional application No. 60/080,188, filed on Mar. 24, 1998.

(51) Int. Cl.[7] .......................... H03H 7/30; H03H 7/40; H03K 5/159
(52) U.S. Cl. ................... 375/233; 370/291; 379/406.08
(58) Field of Search ................. 375/232, 233; 708/322, 323; 370/290, 291, 286; 379/406.08, 406.09

(56) References Cited

U.S. PATENT DOCUMENTS

| | | | |
|---|---|---|---|
| 5,428,562 A | 6/1995 | Gay | 708/322 |
| 5,663,955 A | * 9/1997 | Iyengar | 370/291 |
| 5,721,772 A | * 2/1998 | Haneda et al. | 379/406 |
| 5,734,715 A | * 3/1998 | Scalart et al. | 379/410 |

* cited by examiner

Primary Examiner—Chi Pham
Assistant Examiner—Phuong Phu
(74) Attorney, Agent, or Firm—Robert L. Troike; Frederick J. Telecky, Jr.

(57) ABSTRACT

A multi-channel adaptive filter system for use, for example, in echo cancellation for generating an echo estimate for each channel is described. The system includes a forward and backward prediction filter parameter generator that in response to the multi-channel inputs generates a single forward prediction filter vector signal $\vec{\omega}_{p-1}(n)$ and corresponding single forward error F(n) signal and a single backward prediction filter vector signal $\vec{v}_{p-1}(n)$ and corresponding single backward error signal B(n). The system further includes an error generator responsive to errors in the estimated signal for multiplying the errors by a $1-\mu$ where $\mu$ is a constant for generating error vector signals $\vec{e}_{i,p}$–$\vec{e}_{J,p}(n)$ for each channel. A signal generator coupled to the forward and backward prediction filter generator and the error generator for generating vector signals gi,p(n)–gJ,P(n) which are multiplied by adaptation constant to produce pre-filter coefficients. An adaptive filter output generator coupled to said multi-channel input signals and responsive to pre-filter coefficients for providing an echo estimate signal for each of the channels.

9 Claims, 14 Drawing Sheets

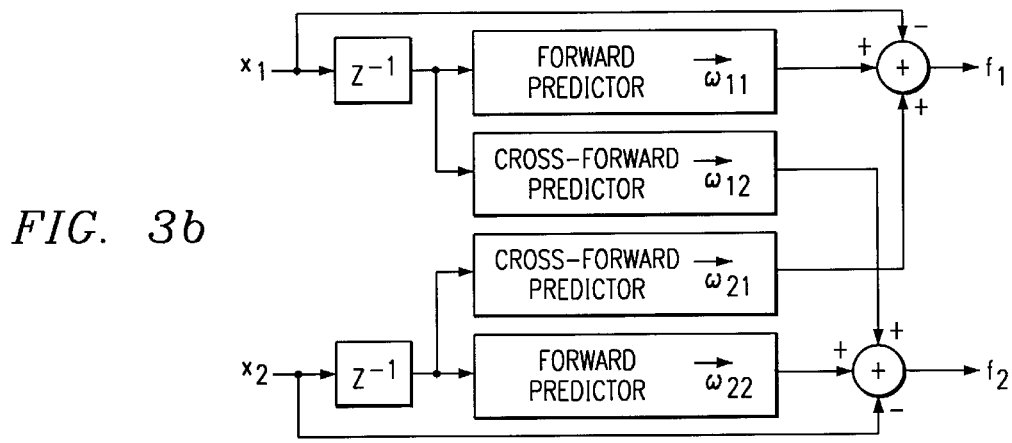
FIG. 3a
FIG. 3b
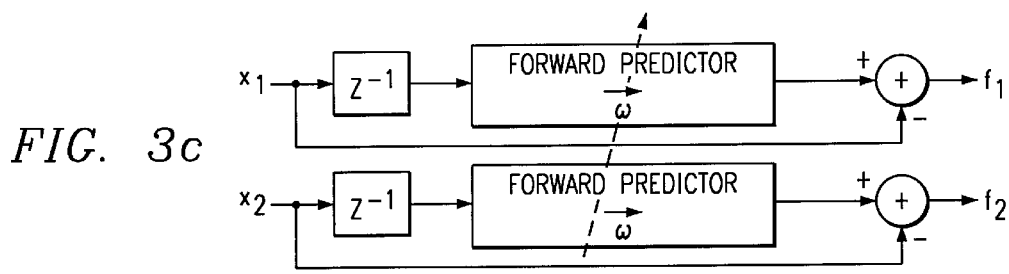
FIG. 3c
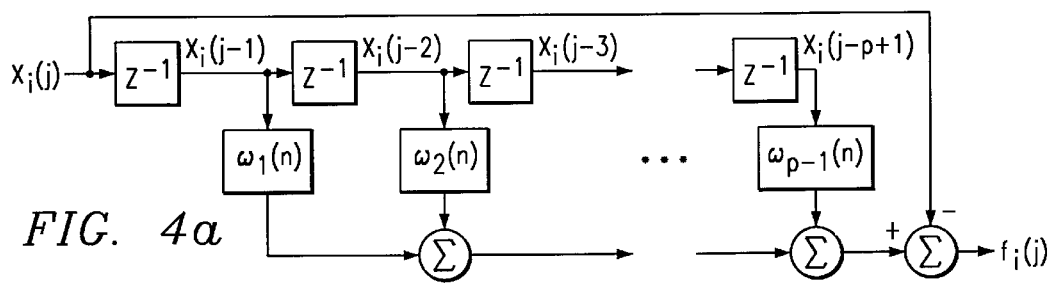
FIG. 4a
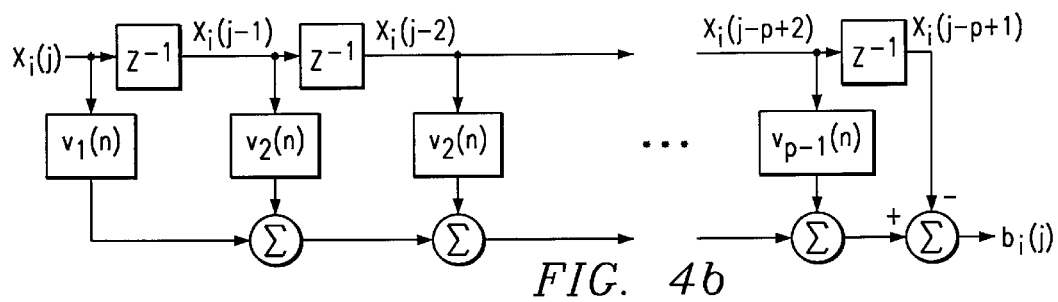
FIG. 4b

MULTI-CHANNEL ADAPTIVE FILTERING

This application claims priority under 35 USC §119(e)(1) of provisional application No. 60/080,188, filed Mar. 24, 1998.

FIELD OF THE INVENTION

This invention relates to adaptive filtering and more particularly to multi-channel adaptive filtering.

BACKGROUND OF THE INVENTION

Multi-channel adaptive filtering appears in several applications like stereophonic or multi-channel acoustic echo cancellation for audio/video conferencing, active noise control, multi-channel equalization, etc. See, for example, "Acoustic Echo Cancellation System" of Murtaza Ali for which a provisional application Ser. No. 09/261,913 was filed Mar. 3, 1998. This application is incorporated herein by reference. Specially in acoustic echo cancellation and active noise control, the input is not necessarily white (without speech). In such cases, the least mean squares technique has poor convergence rate. On the other hand, the number of filter taps is also very high to allow fast recursive least square (FRLS) like techniques due to high computational complexity (e.g., in multi-channel audio-conferencing, the filter may have thousands of taps). In single channel cases, a class of techniques known as the affine projection algorithm and its fast version have been developed that have low complexity and fast convergence. See Y. Kaneda, M. Tanaka and J. Kojina, "An Adaptive Algorithm with Fast Convergence for Multi-Input Sound Control," *ACTIVE*-95, pp. 993–1004, Newport Beach, Calif., July 1995; and S. Gay and S. Tavathia, "The Fast Affine Projection Algorithm," *Proceedings of ICASSP*-95, pp. 3023–3026, 1995. Also see Gay U.S. Pat. No. 5,428,562 incorporated herein by reference.

SUMMARY OF THE INVENTION

In accordance with one embodiment of the present invention a multi-channel filter system for generating an estimated signal for each channel comprises a forward and backward prediction filter generator responsive to multi-channel input signals for generating a single forward prediction vector signal and a corresponding forward error signal and a single backward prediction vector signal and a corresponding backward error signal. An error generator responsive to errors in the estimated signal multiplies the errors by $1-\mu$ for generating error vectors. A pre-filter signal generator responsive to the single forward filter vector signal and corresponding forward error and the single backward filter vector signal and corresponding backward error signal and said error vectors for generating pre-filter coefficients. An adaptive filter output generator coupled to said pre-filter generator and responsive to said pre-filter coefficients and said multi-channel input signals for generating an estimate signal for each channel.

DESCRIPTION OF THE DRAWINGS

FIG. 3a illustrates forward predictor structures used in a single channel FRLS and fast affine projection techniques;

FIG. 3b illustrates two-channel fast FRLS technique as illustrated in FIG. 1;

FIG. 3c illustrates two-channel fast affine projection technique;

FIG. 4a illustrates the structure of predictors for the $i^{th}$ channel forward predictor;

FIG. 4b illustrates the structure of predictors for the $i^{th}$ channel backward predictor;

DESCRIPTION OF PREFERRED EMBODIMENTS OF THE PRESENT INVENTION

Figure 1:
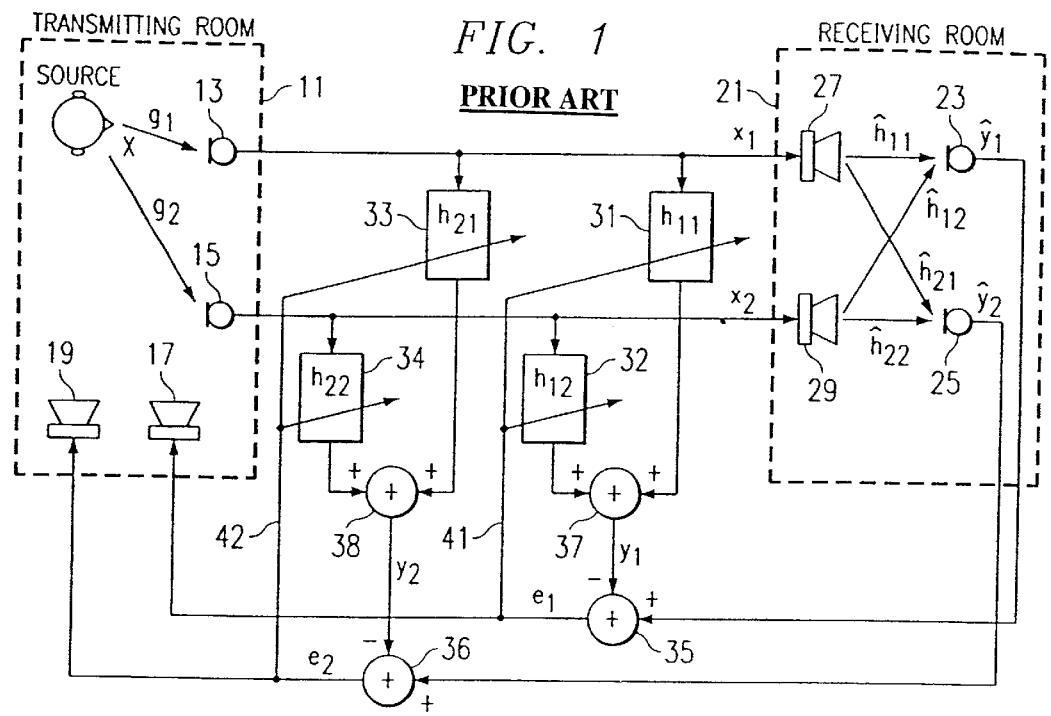
FIG. 1 is a prior art stereophonic echo cancellation system.

FIG. 1 shows the configuration of a typical stereophonic echo cancellation system 10. The transmission room (depicted on the left) 11 has two microphones 13 and 15 that pick up the speech signal, x, via the two acoustic paths characterized by the impulse responses, $g_1$ and $g_2$. All acoustic paths are assumed to include the microphone and/or loudspeaker responses. The $i^{th}$ microphone output is then given by (in the frequency domain)

$$X_i(\omega) = G_i(\omega) X(\omega). \tag{1}$$

In this application, the upper-case letters represent the Fourier transforms of the time-domain signals denoted by the corresponding lower-case letters. The whole system is considered as a discrete-time system ignoring any A/D or D/A converter. These signals are presented through the set of loudspeakers 27 and 29 in the receiving room 21 (on the right in FIG. 1). Each microphone 23 and 25 in the receiving room picks up an echo ($y_1$, $y_2$ in FIG. 1) from each of the loudspeakers. Let $\hat{h}_{ij}$ be the acoustic path impulse response from the $J^{th}$ loudspeaker to the $i^{th}$ microphone. In FIG. 1 the path from speaker 27 to microphone 23 is $\hat{h}_{11}$, the path from speaker 27 to microphone 25 is $\hat{h}_{21}$, the path from speaker 29 to microphone 25 is $\hat{h}_{22}$ and from speaker 29 to microphone 23 is $\hat{h}_{12}$. Then the echoes $(\hat{y}_1,\hat{y}_2)$ picked up by the microphones 23 and 25 in the receiving room 21 are given by (in the frequency domain)

$$Y_i(\omega) = \sum_j H_{ij}(\omega)X_j(\omega) \qquad (2)$$

In the absence of any AEC, the echoes $\hat{y}_i$'s will be passed back to the loudspeaker 17, 19 in the transmission room 11 and will be recirculated again and again. This will cause multiple echoes or may even result in howling instability. Commonly used AEC systems use adaptive finite impulse response (FIR) filters that provide estimates of the echo path responses. The FIR filter coefficients are updated adaptively depending on the input signals to the loudspeaker and the outputs of the microphones.

In the stereophonic AEC, there are four echo paths $(\hat{h}_{11},\hat{h}_{12},\hat{h}_{21}$ and $\hat{h}_{22})$ to be identified. We, therefore, need four adaptive filters 31–34 as shown in FIG. 1. Filter 31 is the estimate for the $\hat{h}_{11}$ path, filter 32 is the estimate for the $\hat{h}_{12}$, path, filter 33 is the estimate for the $\hat{h}_{21}$ path and filter 34 is the estimate for the $\hat{h}_{22}$ path. The estimates $\hat{h}_{11}$ and $\hat{h}_{12}$ of paths to echo $y_1$ are summed at 37 and the estimates $h_{21}$ and $h_{22}$ of paths to echo $y_2$ are summed at 38. The output of the AEC filters (which can be thought of as an estimated echo) are as follows $$Y_i(\omega) = \sum_j H_{ij}(\omega)X_j(\omega)$$

These estimated echoes at 37 and 38 are subtracted at adders 35 and 36 from the true echoes from $\hat{y}_1$ and $\hat{y}_2$ giving the error signals ($e_1$ and $e_2$ in FIG. 1), $$E_i(\omega) = \hat{Y}_i(\omega) - Y_i(\omega)$$

These error signals are used to update the filter 31–34 coefficients (represented by feedback lines 41,42). Several techniques are available to calculate the filter updates (e.g., the least means square (LMS), the recursive least square (RLS), the affine projection (AP) algorithms, etc.). All these techniques attempt to minimize these error signals in one way or another.

Figure 2:
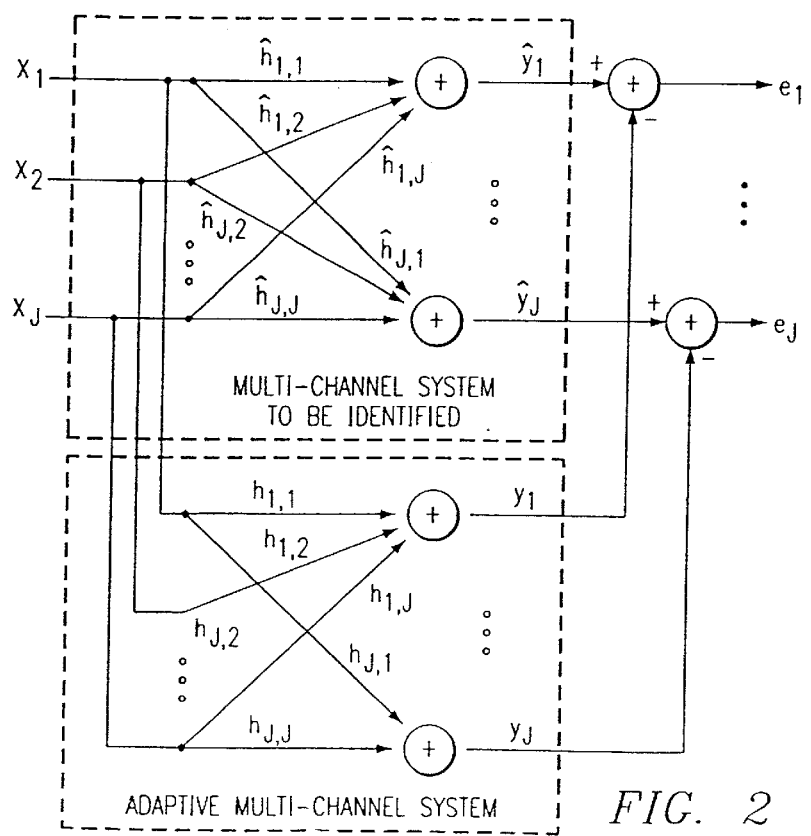
FIG. 2 illustrates a multi-channel adaptive filtering system with channels.

FIG. 2 shows a multi-channel adaptive filtering system with J inputs ($X_1$–$X_j$) and J outputs ($Y_1$–$Y_j$). The input to the $i^{th}$ channel is $X_i$, the response from the $i^{th}$ input to the $J^{th}$ output is represented by $\hat{h}_{j,i}$ and $\hat{y}_i$ is the $i^{th}$ output. In the adaptive system (lower half of FIG. 2), the response from the $i^{th}$ input to the $j^{th}$ output is modeled by the finite impulse response (FIR) filter $h_{j,i}$ (like filters 31–34 in FIG. 1) with $y_i$ being $i^{th}$ output of the multi-channel (MC) adaptive filtering system. The errors $e_i$'s ($e_1$–$e_j$) are used to update the adaptive filters $h_{j,i}$ (like 31–34). We assume here that the length of the adaptive filters be L.

The basic affine projection technique for MC adaptive filtering is presented in Table 1.

TABLE 1

$$\vec{e}_{i,p}(n) = \vec{y}_{i,p}(n) - \sum_{j=1}^{J} X^T_{j,p}(n)\vec{h}_{i,j}(n) \qquad (3.1)$$

$$\vec{g}_{i,p}(n) = \left[\sum_{j=1}^{J} X^T_{j,p}(n)X_{j,p}(n)\right]^{-1} \vec{e}_{i,p}(n) \qquad (3.2)$$

$$\vec{h}_{i,j}(n+1) = \vec{h}_{i,j}(n) + \mu X_{j,p}(n)\vec{g}_{i,p}(n) \qquad (3.3)$$

Here $$\vec{e}_{i,p}(n) = \begin{bmatrix} e_i(n) \\ e_i(n-1) \\ e_i(n-p+1) \end{bmatrix}$$

is a p dimensional vector consisting of the p past a-priori errors of the $i^{th}$ channel. Similarly, the vectors $\vec{y}_{i,p}(n)$ and $\vec{x}_{i,L}(n)$ consist of p past outputs and L past inputs respectively each corresponding to the $i^{th}$ channel, i.e., $$\vec{y}_{i,p}(n) = \begin{bmatrix} y_i(n) \\ y_i(n-1) \\ \ldots \\ y_i(n-p+1) \end{bmatrix} \quad \text{and} \quad \vec{x}_{i,L}(n) = \begin{bmatrix} x_i(n) \\ x_i(n-1) \\ \ldots \\ x_i(n-L+1) \end{bmatrix}$$

Then, $X_{j,p}(n)$ is defined as the L×p data matrix $$X_{j,p}(n) = [\vec{x}_{j,L}(n) \; \vec{x}_{j,L}(n-1) \ldots \vec{x}_{j,L}(n-p+1)]$$

The MCAP technique ensures that the filter update vector with $\mu=1$ is the minimum norm solution that results in zero a-posteriori error in the past p time instances in all the channels. p is called the projection order. p is in general between 1 to 64. In general, the higher the value of p, the better is the convergence and the lower is the final error. $\mu$ is called the adaptation constant. It can be used to some degree to control convergence rate and final error. Usually higher $\mu$ results in faster convergence but higher final error. Typical values of $\mu$ lie in the range of 0.1 to 1.0. The computational complexity in terms of the number of multiply-accumulate (MAC) operations of the MC affine projection technique as given above is extremely high ($J^2Lp$ for each of the equations 3.1 and 3.3 and $O(Jp^3)$ for the matrix inversion in equation 3.2 resulting in a total complexity of $2J^2Lp+O(Jp^3)$).

A fast version for the multi-channel affine projection technique is presented in Table 2. This was disclosed by Kaneda et al. In this fast version, the adaptive filter coefficient $\vec{h}_{i,j}(n)$ is not updated directly. Rather the vector $\vec{z}_{i,j}(n)$

TABLE 2

Update auto-correction vector:

$\vec{r}_{i,p-1}(n) = \vec{r}_{i,p-1}(n-1) + x_i(n)\vec{x}_{i,p-1}(n-1) - x_i(n-L)\vec{x}_{i,p-1}(n-1-L)$ TABLE 2-continued Update error vector:

$$e_{i,1}(n) = y_i(n) - \sum_{j=1}^{J} [\vec{r}_{j,p-1}^T(n)\vec{s}_{j,p-1}(n) + \vec{x}_j^T(n)\vec{z}_{i,j}(n)] \quad (3.4)$$

$$\vec{e}_{i,p}(n) = \begin{bmatrix} e_{i,1}(n) \\ (1-\mu)\vec{e}_{i,p-1}(n-1) \end{bmatrix} \quad (3.5)$$

Update pre-filtering vector;

$$\vec{g}_{i,p}(n) = [R_p(n)]^{-1}\vec{e}_{i,p}(n) \quad (3.6)$$

$$\vec{s}_{i,p}(n) = \begin{bmatrix} 0 \\ \vec{s}_{i,p-1}(n-1) \end{bmatrix} + \mu \vec{g}_{i,p}(n) \quad (3.7)$$

Update approximation vector:

$$\vec{z}_{i,j}(n+1) = \vec{z}_{i,j}(n) + \vec{x}_j(n-p+1)s_{i,p}(n) \quad (3.8)$$

Here, $$R_p(n) = \sum_{j=1}^{J} [X_{j,p}^T(n)X_{j,p}(n)] \quad (3.9)$$

$$s_{i,1}(n) = [s_{i,1}(n), s_{i,2}(n), \ldots, s_{i,J}(n)]^\tau \quad (3.10)$$
$$e_{i,1}(n) = [e_{i,1}(n), e_{i,2}(n), \ldots, e_{i,J}(n)]^\tau \quad (3.11)$$

is updated. This vector is called the approximation vector as it contains contribution to $\vec{h}_{i,j}(n)$ of data vectors up to time instant n−p. The contribution of data vectors from time instants n−p+1 to n is contained in the pre-filtering vector $\vec{g}_{i,p}(n)$. This pre-filtering vector is used to update the vector $\vec{s}_{i,p}(n)$ in equation 3.7 which is, in turn, used in equation 3.4 to calculate the a priori error $e_{i,1}(n)$ and in equation 3.8 to update $\vec{z}_{i,j}(n)$. The update of $\vec{g}_{i,p}(n)$ in equation 3.6 requires inversion of the matrix $R_p(n)$ as defined in equation 3.9. The computational complexity of the technique shown in equations 3.4–3.11 of Table 2 is as follows: $J^2(p+L)$ for equation 3.4, $J^2L$ for equation 3.8, $O(Jp^3)$ for equation 3.6 and 4Jp for the rest of the equations. The total complexity is then $2J^2L+(J^2+4J)p+O(Jp^3)$. The technique disclosed in Kaneda et al. cited above suggests the use of matrix inversion lemma to calculate the update of $R_p^{-1}(n)$ from $R_p^{-1}(n-1)$ thereby reducing the complexity from $O(Jp^3)$ to $O(Jp^2)$ for solving equation 3.6. The complexity then reduces to $2J^2L+(J^2+8J)p+4Jp^2$, i.e., the complexity is linear in L, the length of the adaptive filters but still quadratic in p, the projection order. The proposed technique in this application further reduces this complexity to be linear in both L and p.

The technique described in this application is based on forward and backward linear predictors. See S. Haykin, *Adaptive Filter Theory*, Prentice-Hall New Jersey, 1986. These predictors are also used in Gay et al. cited above to obtain fast affine projection technique for single channel case. In fact, the two techniques in Kaneda et al. and Gay et al. are very similar. They only differ in the way equation 3.6 in Table 2 is calculated. The technique in Kaneda et al. uses matrix inversion lemma and that in Gay et al. uses forward and backward linear predictors. The technique in Kaneda et al. can be directly extended to multi-channel affine projections. However, in order to extend the predictor based approach used in Gay et al., applicants teach to redefine the forward and backward linear predictors.

For single channel (e.g., only channel 1 exists in FIG. 2, the p×p matrix $R=R_{11}=X_{1,p}^{T(n)}X_{1,p}(n)$ can be efficiently inverted by defining a forward linear predictor $\vec{\omega}$ of length p−1. This filter predicts $x_1(n)$ from the p−1 past data $x_1(n-1), x_1(n-2), \ldots, x_1(n-p+1)$ (i.e., minimizes $E[(x(n)-\vec{x}_{1,p-1}^T(n-1)\vec{\omega})^2]$)(see FIG. 3(a)) and a backward linear predictor $\vec{v}$ of length p−1 that predicts $x_1(n-p+1)$ from the p−1 future data $x_1(n), x_1(n-2) \ldots x_1(n-p+2)$. Similar techniques are also used in Levinson-Durby algorithm for inverting auto-correlation matrices (see Haykin cite above) as well as in Fast Recursive Least Squares Technique (FRLS) for adaptive filtering (see J. M. Cioffi and T. Kailath, "Windowed Fast Transversal Filters Adaptive Algorithms with Normalization," *IEEE Transactions on Acoustics, Speech and Signal Processing*, Vol. ASSP-33, No. 3, June 1985. We note here that multi-channel FRLS exists and uses a total of $J^2$ forward linear predictors (see FIG. 3(b) for J=2) and another $J^2$ backward predictors. These predictors are useful in inverting matrices of form $$R = \begin{bmatrix} R_{11} & R_{12} \\ R_{21} & R_{22} \end{bmatrix}.$$

For the case under consideration, we have to invert a matrix of form $R=[R_{11}+R_{22}]$. In this case, the predictors shown in FIG. 3(b) cannot be used. These predictors use cross-predictors as well as self-predictors to predict the current value (for the forward linear predictor) of particular channel from the past values of all the input channels and the minimization of the output error for a given output channel can be done independent of the other output channels. However, for inverting $R=[R_{11}+R_{22}]$, we need the structure of predictors as shown in FIG. 3(c). The peculiarity of these predictors is that we do not have any cross-channel. On the other hand, we are constrained to use the same predictor for all the channels. The combined output energy of all the channels are to be minimized to arrive at the required predictor. Based on this definition, we will now derive the required algorithm for the applicant's novel fast affine projection technique. In particular, we shall show how these predictors can be used to obtain update of $\vec{g}_{i,p}(n)$(see equation 3.6) in O(Jp) operations.

The structure for the forward predictor is shown in FIG. 4(a). The error in the $i^{th}$ forward prediction filter at time instant n given by $$\vec{\omega}_{p-1}(n) = \begin{bmatrix} \omega_1(n) \\ \omega_2(n) \\ \cdots \\ \omega_{p-1}(n) \end{bmatrix}$$

$$f_i(j) = x(j) - \vec{\omega}_{i,p-1}(n)^T \vec{x}_{i,p-1}(j-1).$$

The predictor $\vec{\omega}_{p-1}(n)$ (a p−1×1 dimensional vector) is chosen in such a way that minimizes the error criterion (squared error of all channels within a data window of length equal to the size of the adaptive filters)

$$J_f(n) = \sum_{i=1}^{J} \sum_{k=0}^{L-1} f_i^2(n-k). \quad (4.12)$$

Minimizing the above leads to the solution $$\vec{\omega}_{p-1}(n) = R_{p-1}^{-1}(n-1)\vec{r}_{p-1}(n) \quad (4.13)$$

where $$R_{p-1}(n-1) = \sum_{i=1}^{J}\sum_{k=0}^{L-1} \vec{x}_{i,p-1}(n-k-1)\vec{x}_{i,p-1}^T(n-k-1), \quad (4.14)$$

$$\vec{r}_{p-1}(n) = \sum_{i=1}^{J} \vec{r}_{i,p-1}(n),$$

$$\vec{r}_{i,p-1}(n) = \sum_{k=0}^{L-1} x_i(n-k)\vec{x}_{i,p-1}(n-k-1).$$

The least squared error for this optimum forward filter can be written as (from equation 4.12)

$$F(n) = r_0(n) - \vec{r}_{p-1}^T(n)\vec{\omega}_{p-1}(n) \quad (4.15)$$

where (4.16)

$$r_0(n) = \sum_{i=1}^{J}\sum_{k=0}^{L-1} x_i^2(n-k). \quad (4.17)$$

Equations 4.13 and 4.15 can be combined in the following matrix vector equation $$\begin{bmatrix} r_0(n) & \vec{r}_{p-1}^T(n) \\ \vec{r}_{p-1}(n) & R_{p-1}(n-1) \end{bmatrix} \begin{bmatrix} 1 \\ -\vec{\omega}_{p-1}(n) \end{bmatrix} = \begin{bmatrix} F(n) \\ \vec{0} \end{bmatrix}. \quad (4.18)$$

The key to finding a fast solution is iterative update for the forward prediction filters. In order to do so, we need updates for $R_{p-1}(n)$ and $\vec{r}_{p-1}(n)$. The matrix $R_{p-1}(n)$ can be written as $$R_{p-1}(n) = R_{p-1}(n-1) + \sum_{i=1}^{J}\left[\vec{x}_{i,p-1}(n)\vec{x}_{i,p-1}^T(n) - \vec{x}_{i,p-1}^T(n-L)\vec{x}_{i,p-1}^T(n-L)\right]$$

$$= R_{p-1}(n-1) + U_{p-1}(n)VU_{p-1}^T(n)$$

where $$U_{p-1}(n) = [\vec{x}_{1,p-1}(n)\vec{x}_{2,p-1}(n) \ldots \vec{x}_{J,p-1}(n)\vec{x}_{1,p-1}(n-L)$$
$$\vec{x}_{2,p-1}(n-L) \ldots \vec{x}_{J,p-1}(n-L)],$$

$$V = \begin{bmatrix} I_J & 0 \\ 0 & -I_J \end{bmatrix}.$$

Here, $I_J$ is the J dimensional identity matrix and $U_{p-1}(n)$ represents a p−1×2J dimensional matrix whose columns are the p−1 dimensional data vectors of all the channels at time instants n and n−L.

Using matrix inversion lemma (see Haykin reference), the update for the inverse of the corresponding matrix can be written as $$R_{p-1}^{-1}(n) = R_{p-1}^{-1}(n-1) - R_{p-1}^{-1}(n-1)U_{p-1}(n)[V+U_{p-1}^T(n)R_{p-1}^{-1}(n-1)U_{p-1}(n)]^{-1}$$

$$U_{p-1}^T(n)R_{p-1}^{-1}(n-1) = R_{p-1}^{-1}(n-1) - k_{p-1}(n)U_{p-1}^T(n)R_{p-1}^{-1}(n-1)$$

where $$k_{p-1}(n) = R_{p-1}^{-1}(n-1)U_{p-1}(n)[V+U_{p-1}^T(n)R_{p-1}^{-1}(n-1)U_{p-1}(n)]^{-1}.$$

Here, $k_{p-1}(n)$ is a p−1×2J matrix. From the above equation, $$k_{p-1}(n)[V+U_{p-1}^T(n)R_{p-1}^{-1}(n-1)U_{p-1}(n)] = R_{p-1}^{-1}(n-1)U_{p-1}(n)k_{p-1}(n)V = [R_{p-1}^{-1}(n-1)-k_{p-1}(n)U_{p-1}^T(n)R_{p-1}^{-1}(n-1)]U_{p-1}(n)k_{p-1}(n) = R_{p-1}^{-1}(n)[U_{p-1}(n)V].$$

The update for $\vec{r}_{p-1}(n)$ can be written as $$\vec{r}_{p-1}(n) = \vec{r}_{p-1}(n-1) + \sum_{i=1}^{J} x_i(n)\vec{x}_{1,p-1}(n-1) -$$

$$\sum_{i=1}^{J} x_i(n-L)\vec{x}_{1,p-1}(n-L-1)$$

$$= \vec{r}_{p-1}(n-1) + U_{p-1}(n-1)V\vec{d}(n)$$

where $$\vec{d}(n) = \begin{bmatrix} x_1(n) \\ x_2(n) \\ \ldots \\ x_J(n) \\ x_1(n-L) \\ x_2(n-L) \\ \ldots \\ x_J(n-L) \end{bmatrix}$$

Now the update for the forward prediction filter can be written as $$\vec{\omega}_{p-1}(n) = R_{p-1}^{-1}(n-1)\vec{r}_{p-1}(n)$$

$$= R_{p-1}^{-1}(n-1)[\vec{r}_{p-1}(n-1) + U_{p-1}(n-1)V\vec{d}(n)]$$

$$= R_{p-1}^{-1}(n-2)\vec{r}_{p-1}(n-1) - k_{p-1}(n-1)U_{p-1}^T(n-1)$$

$$R_{p-1}^{-1}(n-2)\vec{r}_{p-1}(n-1) + k_{p-1}(n-1)\vec{d}(n)$$

$$= \vec{\omega}_{p-1}(n-1) + k_{p-1}(n-1)$$

$$[\vec{d}(n) - U_{p-1}^T(n-1)\vec{\omega}_{p-1}(n-1)]$$

$$= \vec{\omega}_{p-1}(n-1) + k_{p-1}(n-1)\vec{\eta}(n)$$

where $$\vec{\eta}(n) = \vec{d}(n) - U_{p-1}^T(n-1)\vec{\omega}_{p-1}(n-1).$$

The p−1 dimensional vector $\vec{\eta}(n)$ is the so-called a-priori error or the innovation representing the error corresponding to the previously obtained prediction filter.

Let us now focus our attention on the update of the forward error F(n). Since $r_0(n)$ in equation 4.17 can be written as $$r_0(n) = r_0(n-1) + \sum_{i=1}^{J} x_i(n)^2 - \sum_{i=1}^{J} x_i(n-L)^2$$

$$= r_0(n-1) + \vec{d}^T(n)V\vec{d}(n),$$

we have from equation 4.15, $$F(n) = r_0(n-1) + \vec{d}^T(n)V\vec{d}(n) - \vec{r}_{p-1}^T(n)$$
$$[\vec{w}_{p-1}(n-1) + k_{p-1}(n-1)\vec{\eta}(n)]$$
$$= r_0(n-1) + \vec{d}^T(n)V\vec{d}(n) - [\vec{r}_{p-1}^T(n-1) + \vec{d}^T(n)VU_{p-1}^T(n-1)]$$
$$\vec{\omega}_{p-1}(n-1) - \vec{r}_{p-1}^T(n)k_{p-1}(n-1)\vec{\eta}(n)$$
$$= F(n-1) + \vec{d}^T(n)V[\vec{d}(n) - U_{p-1}^T(n-1)\vec{\omega}_{p-1}(n-1)] -$$
$$\vec{r}_{p-1}^T(n)k_{p-1}(n-1)\vec{\eta}(n)$$
$$= F(n-1) + [\vec{d}^T(n)V - \vec{r}_{p-1}^T(n)k_{p-1}(n-1)]\vec{\eta}(n)$$
$$= F(n-1) + [\vec{d}^T(n)V - \vec{r}_{p-1}^T(n)R_{p-1}^{-1}(n-1)U_{p-1}(n-1)V]\vec{\eta}(n)$$
$$= F(n-1) + [\vec{d}^T(n) - \vec{\omega}_{p-1}^T(n)U_{p-1}(n-1)]V\vec{\eta}(n)$$
$$= F(n-1) + \vec{f}^T(n)V\vec{\eta}(n)$$

where $$\vec{f}(n) = \vec{d}(n) - U_{p-1}^T(n-1)\vec{\omega}_{p-1}(n).$$

Here $\vec{f}(n)$ represents the a posteriori error vector. Let us now summarize the update equations for the forward prediction filters. First calculate the a priori errors using $$\vec{\eta}(n) = \vec{d}(n) - U_{p-1}^T(n-1)\vec{\omega}_{p-1}(n-1).$$

Then update the forward prediction filter $$\vec{\omega}_{p-1}(n) = \vec{\omega}_{p-1}(n-1) + k_{p-1}(n-1)\vec{\eta}(n).$$

Now determine the a posteriori error $$\vec{f}(n) = \vec{d}(n) - U_{p-1}^T(n-1)\vec{\omega}_{p-1}(n).$$

Finally, update the forward error $$F(n) = F(n-1) + \vec{f}^T(n)V\vec{\eta}(n).$$

In the above equations, we need update equations for the gain matrix $k_{p-1}(n-1)$. This will be done using the backward prediction filter.

The structure for the backward predictor is shown in FIG. 4(b). As in the case of forward predictors, the error in the $i^{th}$ channel for the backward prediction filter $\vec{v}_{p-1}(n)$ at time instant n given by $$\vec{v}_{p-1}(n) = \begin{bmatrix} v_1(n) \\ v_2(n) \\ \dots \\ v_{p-1}(n) \end{bmatrix}$$

$$b_i(j) = x(j-p+1) - \vec{v}_{p-1}(n)^T \vec{x}_{i,p-1}(j). \quad (4.19)$$

The predictor $\vec{v}_{p-1}(n)$ (a p−1×1 dimensional vector) is chosen in such a way that minimizes the error criterion $$J(n) = \sum_{i=1}^{J} \sum_{k=0}^{L-1} b_i^2(n-k).$$

Minimizing the above leads to the solution $$\vec{v}_{p-1}(n) = R_{p-1}^{-1}(n)\vec{r}'_{p-1}(n) \quad (4.20)$$

where $$R_{p-1}(n) = \sum_{i=1}^{J} \sum_{k=0}^{L-1} \vec{x}_{i,p-1}(n-k)\vec{x}_{i,p-1}^T(n-k), \quad (4.21)$$

$$\vec{r}'_{p-1}(n) = \sum_{i=1}^{J} \vec{r}'_{i,p-1}(n),$$

$$\vec{r}'_{i,p-1}(n) = \sum_{k=0}^{L-1} x_i(n-k-p+1)\vec{x}_{i,p-1}(n-k).$$

The least squared error for this optimum backward filter can be written as (from equation 4.19)

$$B(n) = r_0(n-p+1) - \vec{r}'_{p-1}{}^T(n)\vec{v}_{p-1}(n). \quad (4.22)$$

Equations 4.20 and 4.22 can be combined in the following matrix vector equation $$\begin{bmatrix} R_{p-1}(n) & \vec{r}'_{p-1}(n) \\ \vec{r}'^T_{p-1}(n) & r_0(n-p+1) \end{bmatrix} \begin{bmatrix} -\vec{v}_{p-1}(n) \\ 1 \end{bmatrix} = \begin{bmatrix} \vec{0} \\ B(n) \end{bmatrix}. \quad (4.23)$$

Using exactly the same techniques as done for the forward prediction filter, update equations for the backward prediction filter, the corresponding a priori and a posteriori errors can be calculated using the following iterative equations. First, calculate the a priori errors using $$\vec{v}(n) = \vec{d}(n-p+1) - U_{p-1}^T(n)\vec{v}_{p-1}(n-1).$$

Then update the backward prediction filter $$\vec{v}_{p-1}(n) = \vec{v}_{p-1}(n-1) + k_{p-1}(n)\vec{v}(n).$$

Now determine the a posteriori error $$\vec{b}(n) = \vec{d}(n-p+1) - U_{p-1}^T(n)\vec{v}_{p-1}(n).$$

Finally, update the backward error $$B(n) = B(n-1) + \vec{b}^T(n)V\vec{v}(n).$$

Let us first note that the matrix $R_p(n)$ is defined as $$R_p(n) = \sum_{i=1}^{J} \sum_{k=0}^{L-1} \vec{x}_{i,p}(n-k)\vec{x}_{i,p}^T(n-k)$$

$$= \begin{bmatrix} r_0(n) & \vec{r}_{p-1}^T(n) \\ \vec{r}_{p-1}(n) & R_{p-1}(n-1) \end{bmatrix}$$

$$= \begin{bmatrix} R_{p-1}(n) & \vec{r}'_{p-1}(n) \\ \vec{r}'^T_{p-1}(n) & r_0(n-p+1) \end{bmatrix}.$$

The inverse of this matrix can be written in terms of the forward and backward prediction filter parameters in the following way $$R_p^{-1}(n) = \begin{bmatrix} 0 & \vec{0}^T \\ \vec{0} & R_{p-1}^{-1}(n-1) \end{bmatrix} + \frac{1}{F(n)} \begin{bmatrix} 1 \\ -\vec{\omega}_{p-1}(n) \end{bmatrix} [1 - \vec{\omega}_{p-1}^T(n)] \quad (4.24)$$

$$= \begin{bmatrix} R_{p-1}^{-1}(n) & \vec{0} \\ \vec{0}^T & 0 \end{bmatrix} + \frac{1}{B(n)} \begin{bmatrix} -\vec{v}_{p-1}(n) \\ 1 \end{bmatrix} [-\vec{v}_{p-1}^T(n)1]. \quad (4.25)$$

The above can be easily verified by pre and post multiplying the above two expressions by $R_p(n)$ and using equations 4.18 and 4.23 for the respective cases. Now let us define the p×2J dimensional matrix $$U_p(n) = \begin{bmatrix} \vec{d}^T(n) \\ U_{p-1}(n-1) \end{bmatrix} = \begin{bmatrix} U_{p-1}(n) \\ \vec{d}^T(n-p+1) \end{bmatrix}.$$

Also define $$k_p(n) = R_p^{-1}(n) U_p(n) V.$$

Then post multiplying equations 4.24 and 4.25 by $U_p(n)V$, we arrive at the following $$k_p(n) = \begin{bmatrix} \vec{0}^T \\ k_{p-1}(n-1) \end{bmatrix} + \frac{1}{F(n)} \begin{bmatrix} 1 \\ -\vec{\omega}_{p-1}(n) \end{bmatrix} \vec{f}^T(n) V$$

$$= \begin{bmatrix} k_{p-1}(n) \\ \vec{0}^T \end{bmatrix} + \frac{1}{B(n)} \begin{bmatrix} -\vec{v}_{p-1}(n) \\ 1 \end{bmatrix} \vec{b}^T(n) V$$

$$= \begin{bmatrix} k_{p-1}(n) \\ \vec{0}^T \end{bmatrix} + \frac{1}{B(n)} \left[ \begin{bmatrix} -\vec{v}_{p-1}(n-1) \\ 1 \end{bmatrix} - \begin{bmatrix} k_{p-1}(n) \\ \vec{0}^T \end{bmatrix} \vec{v}(n) \right] \vec{b}^T(n) V$$

$$= \begin{bmatrix} k_{p-1}(n) \\ \vec{0}^T \end{bmatrix} \left( I - \frac{1}{B(n)} \vec{v}(n) \vec{b}^T(n) V \right) + \frac{1}{B(n)} \begin{bmatrix} -\vec{v}_{p-1}(n-1) \\ 1 \end{bmatrix} \vec{b}^T(n) V.$$

Let us now define $$k_p(n) = \begin{bmatrix} M(n) \\ \vec{m}^T(n) \end{bmatrix}.$$

Then $$\vec{m}(n) = \frac{1}{B(n)} V \vec{b}(n)$$

and $$M(n) = k_{p-1}(n) - k_{p-1}(n) \vec{v}(n) \vec{m}^T(n) - \vec{v}_{p-1}(n-1) \vec{m}^T(n)$$

$$= k_{p-1}(n) - \vec{v}_{p-1}(n) \vec{m}^T(n).$$

Thus, we have $$k_{p-1}(n) = M(n) + \vec{v}_{p-1}(n) \vec{m}^T(n).$$

On the other hand, $\vec{v}_{p-1}(n)$ can be written as $$\vec{v}_{p-1}(n) = \vec{v}_{p-1}(n-1) + k_{p-1}(n) \vec{v}(n)$$

$$= \vec{v}_{p-1}(n-1) + [M(n) + \vec{v}_{p-1}(n) \vec{m}^T(n)] \vec{v}(n),$$

$$\vec{v}_{p-1}(n) = \frac{\vec{v}_{p-1}(n-1) + M(n) \vec{v}(n)}{1 - \vec{m}^T(n) \vec{v}(n)}.$$

Now we have derived all the equations required for updating the gain matrix $k_{p-1}(n)$. The equations of interest are summarized below. Determine the matrix M(n) and the vector $\vec{m}(n)$ using $$k_p(n) = \begin{bmatrix} \vec{0}^T \\ k_{p-1}(n-1) \end{bmatrix} + \frac{1}{F(n)} \begin{bmatrix} 1 \\ -\vec{\omega}_{p-1}(n) \end{bmatrix} \vec{f}^T(n) V$$

$$= \begin{bmatrix} M(n) \\ \vec{m}^T(n) \end{bmatrix}.$$

Then update the backward prediction filter using $$\vec{v}_{p-1}(n) = \frac{\vec{v}_{p-1}(n-1) + M(n) \vec{v}(n)}{1 - \vec{m}^T(n) \vec{v}(n)}.$$

Finally, update the gain matrix $k_{p-1}(n)$ $$k_{p-1}(n) = M(n) + \vec{v}_{p-1}(n) \vec{m}^T(n).$$

The previous analysis determines the iterative equations to update the forward and the backward prediction filters, the corresponding gain vectors and the forward and backward errors. We, however, still need to find fast update equations for the pre-filtering vectors $\vec{g}_{i,p}(n)$ (see equation 3.6).

Let us first define the vector $$\vec{g}'_{i,p-1}(n) = R_{p-1}^{-1}(n) \vec{e}_{i,p-1}(n).$$

Then post-multiplying equations 4.24 and 4.25 by $\vec{e}_{i,p}(n)$, we arrive at the following two recursions $$\vec{g}_{i,p}(n) = \begin{bmatrix} 0 \\ (1 - \mu) \vec{g}'_{i,p-1}(n-1) \end{bmatrix} + \frac{1}{F(n)} \begin{bmatrix} 1 \\ -\vec{\omega}_{p-1}(n) \end{bmatrix} [1 - \vec{\omega}_{p-1}^T(n) \vec{e}_{i,p}(n)],$$

$$\vec{g}'_{i,p-1}(n) = \vec{g}_{i,p-1}(n) - \frac{1}{B(n)} [-\vec{v}_{p-1}(n)][-\vec{v}_{p-1}^T(n)1] \vec{e}_{i,p}(n).$$

We have thus arrived at the required adaptation technique for fast multi-channel affine projection method for adaptive filtering. This technique is shown in Tables 3 and 4. Table 3 is essentially the same as Table 2 with the difference that the update of the pre-filtering vector, $\vec{g}_{i,p}(n)$, in the proposed technique is done using forward and backward prediction filtering as shown in Table 3.

Let us know look at the number of MAC operations required for the equations in Table 4. The complexity of each equations 4.33, 4.34, 4.35, 4.37, 4.38, 4.40, 4.41, 4.43 and 4.44 is 2Jp, that of 4.39 is 2Jp+p and that for the rest is 2p. In addition, we need two divisions to calculate $$\frac{1}{F(n)}$$

and $$\frac{1}{B(n)}$$

and one division in equation 4.39. Hence, the total complexity for Table 4 is (20J+3)p plus three divisions. Combining with Table 3, the total complexity of the new technique is $2J^2L+(J^2+24J+3)p$ plus three divisions which is linear in both L and p.

TABLE 3

Proposed fast multi-channel affine projection algorithm

Update auto-correlation vector:

$$\vec{r}_{i,p-1}(n) = \vec{r}_{i,p-1}(n-1) + x_i(n)\vec{x}_{i,p-1}(n-1) - x_i(n-L)\vec{x}_{i,p-1}(n-1-L) \quad (4.26)$$

Update error vector:

$$e_{i,1}(n) = y_i(n) - \sum_{j=1}^{J}\left[\vec{r}_{j,p-1}^{T}(n)\vec{s}_{i,p-1}(n) + \vec{x}_j^{T}(n)\vec{z}_{i,j}(n)\right] \quad (4.27)$$

$$\vec{e}_{i,p}(n) = \begin{bmatrix} e_{i,1}(n) \\ (1-\mu)\vec{e}_{i,p-1}(n-1) \end{bmatrix} \quad (4.28)$$

Update pre-filtering vector: Use Table 4 to update $\vec{g}_{i,p}(n)$ $$\vec{s}_{i,p}(n) = \begin{bmatrix} 0 \\ \vec{s}_{i,p-1}(n-1) \end{bmatrix} + \mu\vec{g}_{i,p}(n) \quad (4.29)$$

Update approximation vector:

$$\vec{z}_{i,j}(n+1) = \vec{z}_{i,j}(n) + x_j(n-p+1)s_{i,p}(n) \quad (4.30)$$

Here, $$s_{i,1}(n) = [s_{i,1}(n), s_{i,2}(n), \ldots, s_{i,1}(n)]^{\tau} \quad (4.31)$$
$$e_{i,1}(n) = [e_{i,1}(n), e_{i,2}(n), \ldots, e_{i,1}(n)]^{\tau} \quad (4.32)$$

TABLE 4

Update forward prediction filter parameters:

$$\vec{\eta}(n) = \vec{d}(n) - U_{p-1}^{\tau}(n-1)\vec{\omega}_{p-1}(n-1) \quad (4.33)$$

$$\vec{\omega}_{p-1}(n) = \vec{\omega}_{p-1}(n-1) + k_{p-1}(n-1)\vec{\eta}(n) \quad (4.34)$$

$$\vec{f}(n) = \vec{d}(n) - U_{p-1}^{\tau}(n-1)\vec{\omega}_{p-1}(n) \quad (4.35)$$

$$F(n) = F(n-1) + \vec{\eta}^{\tau}V\vec{f}(n) \quad (4.36)$$

Update gain matrix and backward prediction filter parameters:

$$\vec{v}(n) = \vec{d}(n-p+1) - U_{p-1}^{\tau}(n)\vec{v}_{p-1}(n-1) \quad (4.37)$$

$$k_p(n) = \begin{bmatrix} \vec{0}^{T} \\ k_{p-1}(n-1) \end{bmatrix} + \frac{1}{F(n)}\begin{bmatrix} 1 \\ -\vec{\omega}_{p-1}(n) \end{bmatrix}\vec{f}^{T}(n)V \quad (4.38)$$

$$= \begin{bmatrix} M(n) \\ \vec{m}(n) \end{bmatrix}$$

TABLE 4-continued $$\vec{v}_{p-1}(n) = \frac{\vec{v}_{p-1}(n-1) + M(n)\vec{v}'^T(n)}{1 - \vec{m}^T(n)\vec{v}(n)} \quad (4.39)$$

$$k_{p-1}(n) = M(n) + \tilde{v}_{p-1}(n)\tilde{m}^\tau(n) \quad (4.40)$$
$$\hat{b}(n) = \hat{d}(n-p+1) - \hat{U}_{p-1}^\tau(n)\hat{v}_{p-1}(n) \quad (4.41)$$
$$B(n) = B(n-1) + \tilde{v}(n)V\hat{b}(n) \quad (4.42)$$
Update the pre-filtering vector $$\vec{g}_{i,p}(n) = \begin{bmatrix} 0 \\ (1-\mu)\vec{g}'_{i,p-1}(n-1) \end{bmatrix} + \quad (4.43)$$
$$\frac{1}{F(n)} \begin{bmatrix} 1 \\ -\vec{\omega}_{p-1}(n) \end{bmatrix} [1 - \vec{\omega}_{p-1}^T(n)]\vec{e}_{i,p}(n)$$

$$\vec{g}'_{i,p-1}(n) = \vec{g}_{i,p-1}(n) - \frac{1}{B(n)} [-\vec{v}_{p-1}(n)][-\vec{v}_{p-1}^T(n)1]\vec{e}_{i,p}(n) \quad (4.44)$$

Since the equations in Table 4 are highly recursive, they tend to propagate numerical errors. This can be severe for fixed point operations. One way to avoid numerical stability is to use periodic re-start. Periodic re-start is discussed in Gay et al. cited above. In this technique, the iterative technique in Table 4 is started periodically. The two set of iterations are run in parallel for L iterations After that, the old forward and backward prediction filter parameters are replaced by the new ones. This new iteration is continued until another re-start is carried out. Experiments have shown that this technique is extremely stable.

For clarity of explanation, the illustrative embodiments of the present invention are represented as comprising individual functional blocks. The functions of these blocks may be provided to the use of either shared or dedicated hardware and not limited to hardware capable of executing software. For example, the functions of the processors presented in the figures to follow may be provided by a single share processor. The term 'processor' should not be construed to refer exclusively to hardware capable executing software. The illustrative embodiments may comprise digital signal processor (DSP) into hardware such as Texas Instruments TMS320C54X fixed point DSP and if a floating point TI TMS320C3X, read only memory (ROM) restoring software for media operations, discussed below, and random access memory (RAM) for storing DSP results. Very large scale integration (VLSI) hardware embodiments as well as custom VLSI circuitry in combination with general purpose DSP circuit may also be provided.

Figure 5:
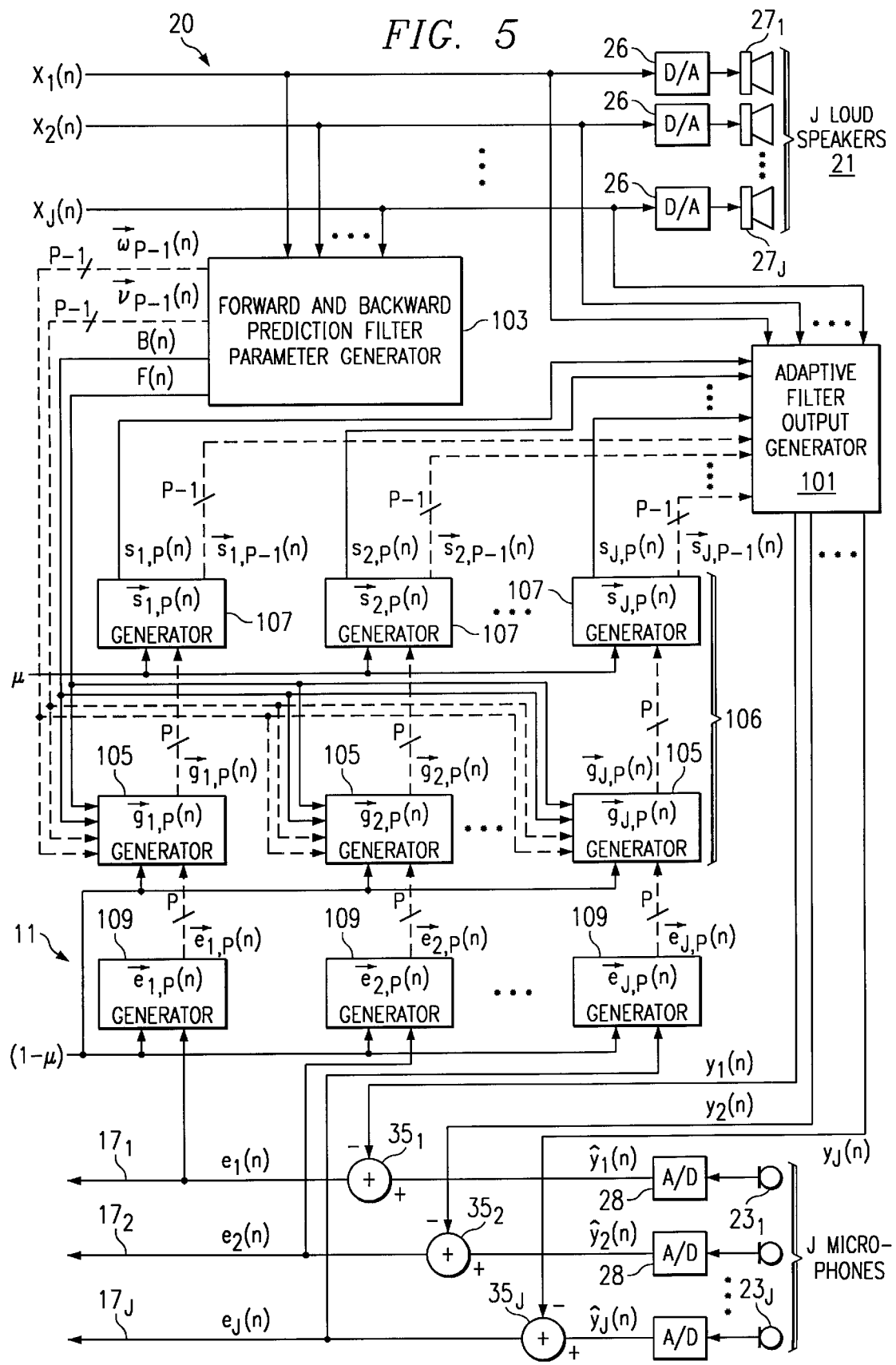
FIG. 5 is a system diagram of the multi-channel adaptive filter system in an echo canceling system.

Referring to FIG. 5, there is illustrated the adaptive filter system 20 between the input lines $X_1(n)$-$X_J(n)$ and the error line $e_1(n)$-$e_J(n)$. The filter system 20 provides an echo estimate signal for each channel to adders 35$_1$–35$_J$. The multi-channel input lines $X_1(n)$-$X_J(n)$ from the transmit room 11 are coupled via D/A (digital to analog) converters 26 to the speakers 21$_1$–27$_J$ in the listening receiving room 21. The J microphones 23$_1$–23$_J$ pick up the input in the listening room and transmit them as outputs to the transmit room 11. The adaptive filter system 20 is coupled to the adders 35$_1$–35$_J$ to provide an echo estimate signal to cancel the echo signals picked up at the J microphones 23$_1$–23$_J$ from the speakers 27$_1$–23$_J$. The errors in the estimated cancellation signal are $e_1(n)$-$e_J(n)$. The adaptive filter system 20 includes an adaptive filter output generator 101 coupled between the input lines $X_1(n)$-$X_J J(n)$ and the adders (doing subtracting 35$_1$–35$_J$). The adaptive filter generator 101 provides the echo estimate signals for each channel $y_1(n)$-$y_J(n)$. The adaptive filter system 20 includes a forward and backward prediction filter parameter generator 103 coupled to the multi-channel input lines $x_1(n)$-$X_J(n)$ to generate single forward prediction filter vector $\vec{\omega}_{p-1}(n)$; corresponding forward prediction error $F(n)$; single backward prediction filter vector $\vec{v}_{p-1}(n)$ and corresponding backward prediction error $B(n)$. The filter system 20 includes an error generator 109 for each channel coupled to each error line $\vec{e}_{1,p}(n)$-$\vec{e}_{J,p}(n)$ carrying signals representing errors in the estimate signal. These estimated error signals are multiplied by constant 1-$\mu$ to produce error vectors $e_{1,p}(n)$-$e_{J,p}(n)$. The constant $\mu$ is a value between 0 and 2 (usually between 0.3 and 1). A pre-filter signal generator 106 comprises generators 105 and 107. Generators 105 are also coupled to constant (1-$\mu$) forward and backward generator 103 and error generator 109. Generators 105 (one for each channel) are responsive to the error vectors $\vec{e}_{1,p}(n)$- $\vec{e}_{J,p}(n)$, the four outputs from forward and backward generator 103 of $\vec{\omega}_{p-1}(n)$, $F(n)$, $\vec{v}_{p-1}(n)$ and $B(n)$ at the constant 1-$\mu$. The output from generator 105 is applied to generators 107 (one for each channel) along with a constant $\mu$. The generators 107 are responsive to the output vectors $\vec{g}_{1,p}(n)$-$\vec{g}_{J,p}(n)$ from generators 105 and $\mu$ to produce the last elements $s_{1,p}(n)$-$s_{J,p}(n)$ and pre-filter vectors $\vec{s}_{1,p-1}(n)$-$\vec{s}_{J,p-1}(n)$. The outputs from generator 107 are applied to the adaptive filter output generator 101.

Figure 6:
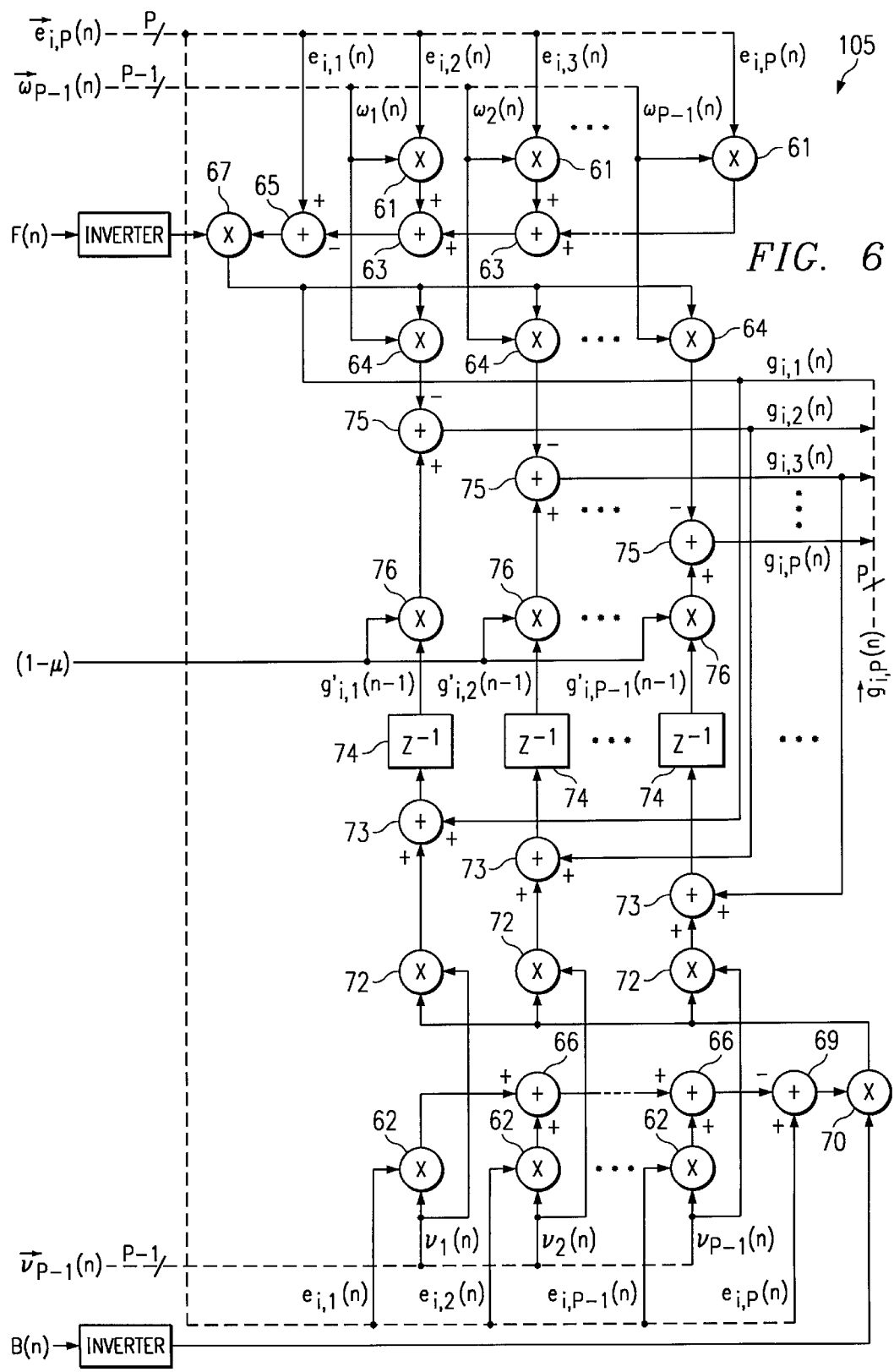
FIG. 6 illustrates $\vec{g}_{i,p}(n)$ signal generator in FIG. 5.

Referring to FIG. 6, there is illustrated an $\vec{g}_{i,p}(n)$ generator 105 (one for each channel) which implements equations 4.43 and 4.44 above. A circle with an "x" in the middle represents a multiplier and a plus represents an adder. The signals representing errors in the estimated signal vectors $\vec{e}_{i,p}(n)$ from the generators 109 are multiplied by the single forward prediction filter vector $\vec{\omega}_{p-1}(n)$ signal at multipliers 61 and summed at adders 63 and subtracted from $e_{i,1}(n)$ at adder 65. The forward prediction error $F(n)$ is inverted and is multiplied by the subtracted value signal from adder 65 producing $g_{i,1}(n)$. The signal of value $g_{i,1}(n)$ is multiplied by $\vec{\omega}_{p-1}(n)$ at multiplier 64 and provided at the negative input to adder 75. The signals representing error vectors $\vec{e}_{i,p}$ from generators 109 are multiplied by the backward prediction filter vector signal $\vec{v}_{p-1}(n)$ at multipliers 62 and the results are summed at adders 66. The signal represented by $\vec{e}_{i,p}(n)$ vector value is subtracted by the signal represented by summed value at adder 69. The subtracted output signal from adder 69 is multiplied by the signal representing backward error B(n) inverted at multiplier 70. The signals represented by the values at the output of multiplier 70 are multiplied by prediction filter vectors $\vec{v}_1(n)$-$\vec{v}_{p-1}(n)$ at multipliers 72. The output from multiplier 72 is summed with the generator outputs $g_{i,1}(n)$-$g_{i,p-1}(n)$ at adders 73. The output from adders 73 are delayed by one clock cycle by delay 74 producing $g'_{i,1}(n-1)$–$g'_{1,p-1}(n-1)$. The delayed outputs are multiplied by fixed constant 1-$\mu$ at multipliers 76 and applied to adders 75 to be subtracted from the outputs from multipliers 64 to provide signal representing $\vec{g}_{i,p}(n)$.

Figure 7:
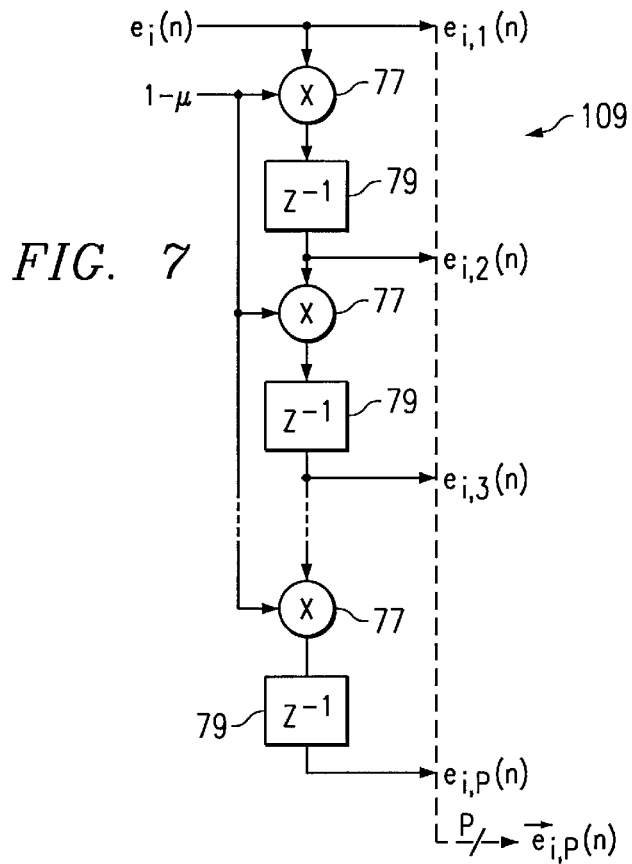
FIG. 7 illustrates error vector $\vec{e}_{i,p}(n)$ signal generator in FIG. 5.

FIG. 7 illustrates an error vector generator 109 generating $\vec{e}_{i,p}(n)$ that implements equation 4.28. The errors $e_i(n)$ are multiplied at multiplier 77 to the 1-$\mu$ constant and delayed by one cycle delays 79 to produce vectors $\vec{e}_{i,1}(n)$-$\vec{e}_{1,p}(n)$ as illustrated.

Figure 8:
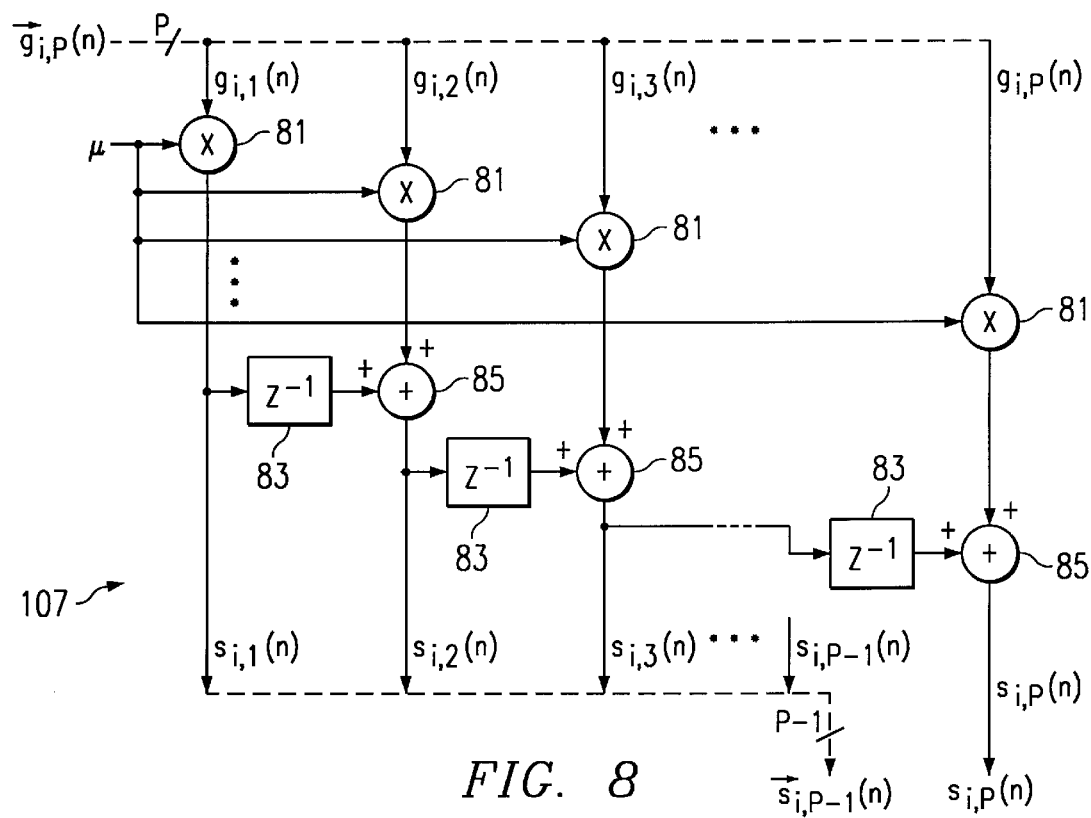
FIG. 8 illustrates pre-filter $\vec{s}_{i,p}(n)$ signal generator in FIG. 5.

FIG. 8 illustrates a generator 107 generating $\vec{s}_{i,p}(n)$ that implements equation 4.29. The outputs $g_{i,1}(n)$-$g_{i,p}(n)$ from generators 105 are multiplied by value $\mu$ at the multipliers 81 and summed with previous cycle vectors (via one cycle delays 83) at adders 85 as shown. For example, $s_{i,2}(n)$ is the sum of $[g_{i,2}(n)]\mu$ and $[g_{i,1}(n)]\mu$ delay one machine cycle by delay 83.

Figure 9:
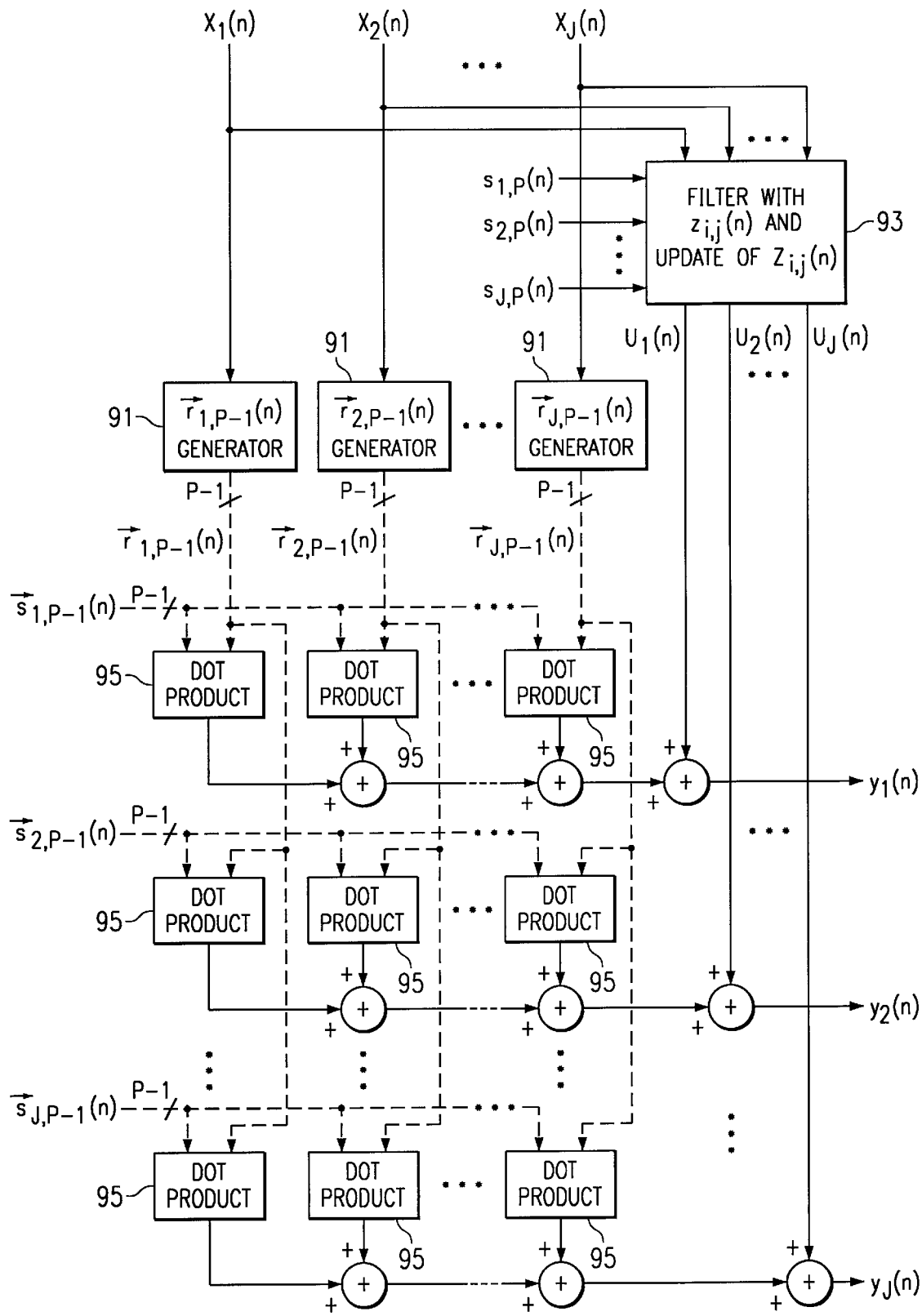
FIG. 9 illustrates adaptive filter output generator in FIG. 5.

FIG. 9 receives the $x_1(n)$-$x_J(n)$ inputs and all the outputs from the pre-filtering generator $s_{i,p}(n)$ and generates the estimated system response implementing equations 4.26, 4.30 and part of 4.27. The adaptive filter output generator includes the auto-correlation vector $\vec{r}_{i,p-1}(n)$ generator 91; the filter 93 with $\vec{Z}_{i,j}(n)$ and update of $\vec{Z}_{i,j}(n)$; and the product stages 95.

Figure 10:
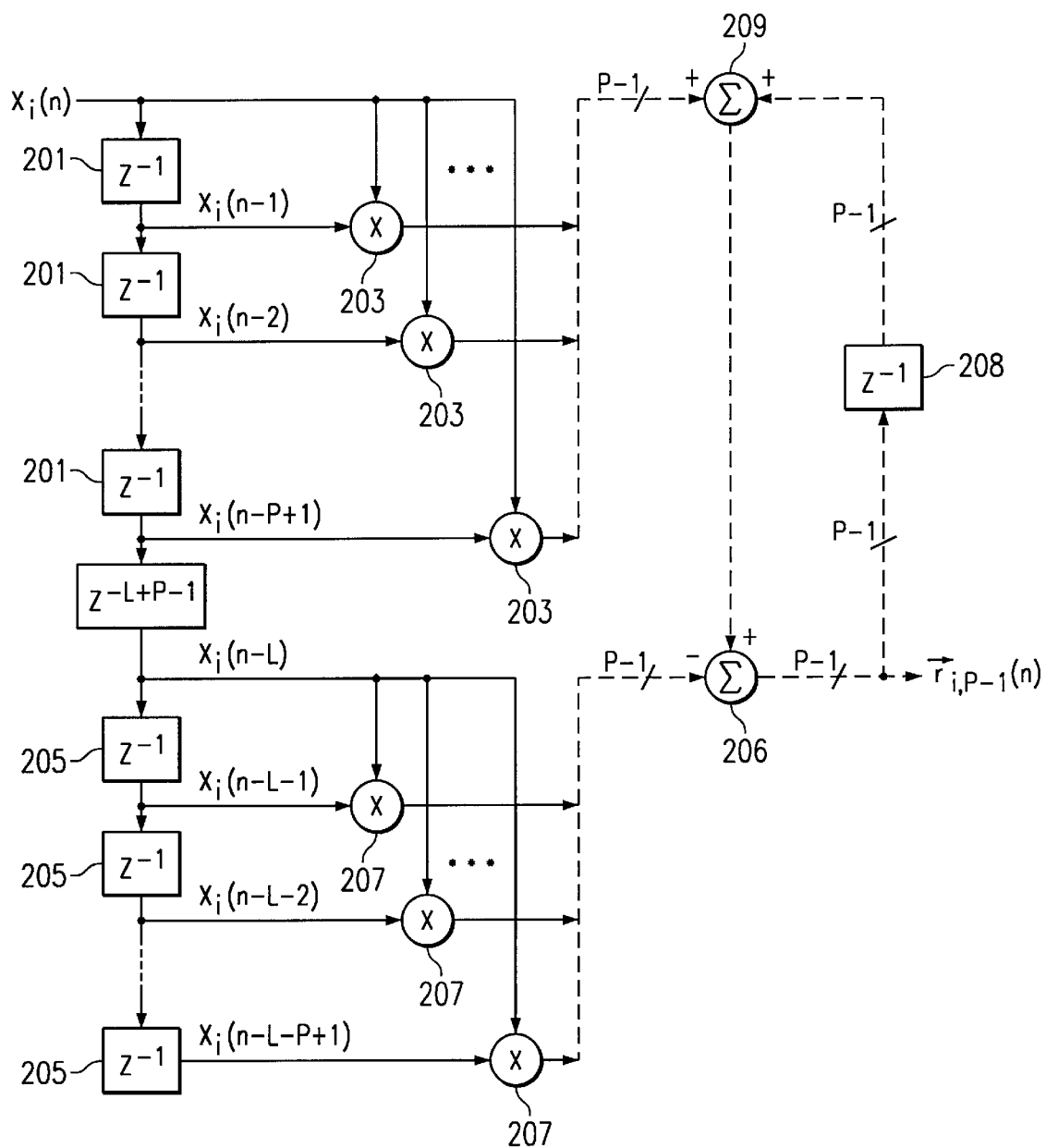
FIG. 10 illustrates auto correlation vector $r_{i,p-1}(n)$ generator for the $i^{th}$ channel.

The auto-correlation vector $r_{i,p-1}(n)$ signal generator 91 for the $i^{th}$ channel is illustrated in FIG. 10 implementing equation 4.26. The $i^{th}$ input signal $x_i(n)$ is multiplied by the previous cycle delayed $x_i^{th}$ inputs using delays 201 and multipliers 203. The $i^{th}$ channel signal delayed by L, $x_i(n-L)$, is multiplied by the previous cycle delayed signal (by delays 205) at multipliers 207. The p–1 vectors from multipliers 203 are summed with the previous p–1 auto-correction vectors $\vec{r}_{i,p-1}(n)$ via delay 208 at summer 209. The output at summer 209 is subtracted at summer 206 from the outputs from multipliers 207.

Figure 11:
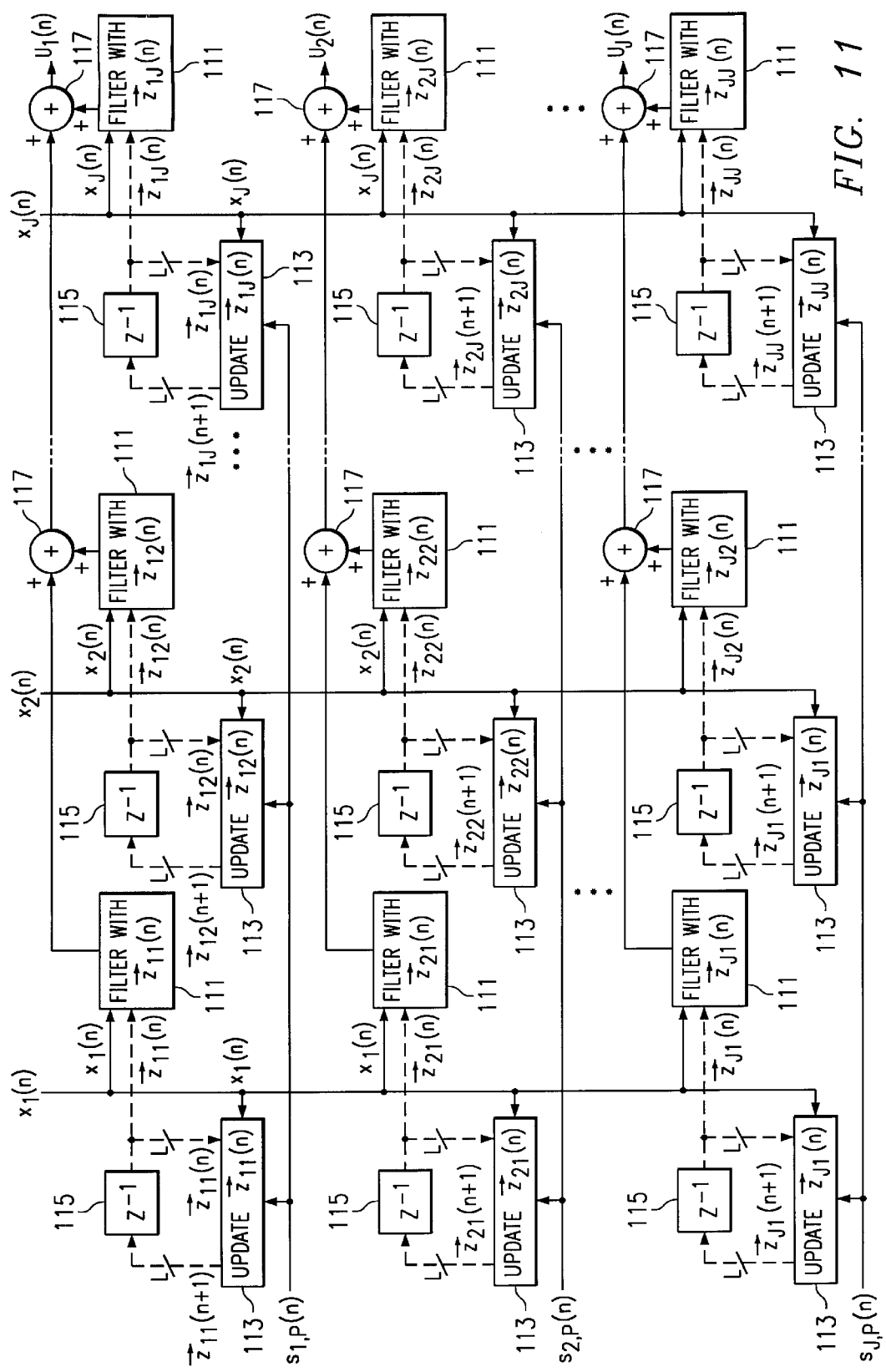
FIG. 11 illustrates filter with $\vec{Z}_{i,j}(n)$ and update of $\vec{Z}_{i,j}(n)$.

FIG. 11 illustrates the filter with $\vec{Z}_{i,j}(n)$ and update of $\vec{Z}_{i,j}(n)$ implementing equations 4.30 and part of 4.27. The $s_{i,p}(n)$-$s_{J,p}(n)$, last element, from the pre-filter generator 107 are applied to update $\vec{Z}_{i,1}(n)$ processors 113 (equation 4.30) providing with one cycle delay 115 updates of $\vec{Z}_{i,j}(n)$ to filters 111 which receive the $x_j(n)$ inputs. The outputs of filters 111 for each $s_{i,p}(n)$ are summed at adders 117 to the filter 111 outputs from the previous line to produce signals $U_1(n)$-$U_J(n)$.

Figure 12:
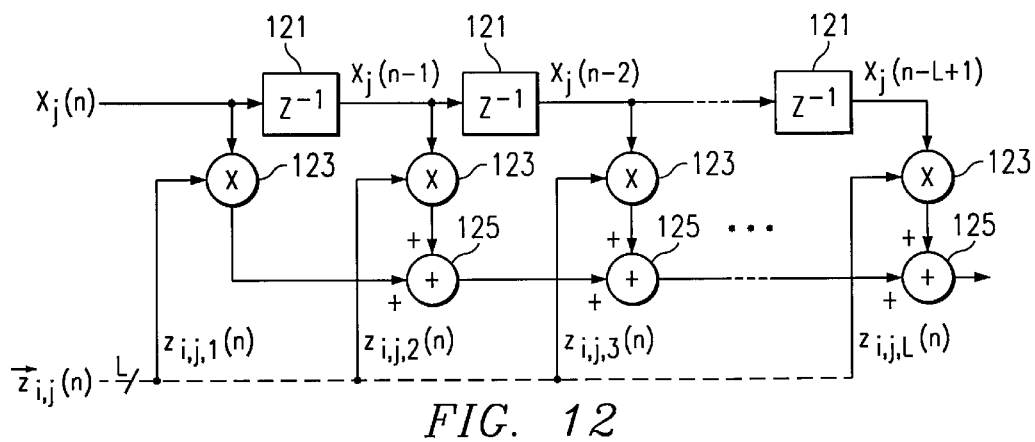
FIG. 12 illustrates filter with $\vec{Z}_{i,j}(n)$.

FIG. 12 illustrates the filter 111 implementing part of equation 4.27 receive $\vec{Z}_{i,j}(n)$ and multiplying that by the input signal $X_j(n)$ and successive one cycle delays 121 at multipliers 123. The outputs from the multipliers are summed at adders 125.

Figure 13:
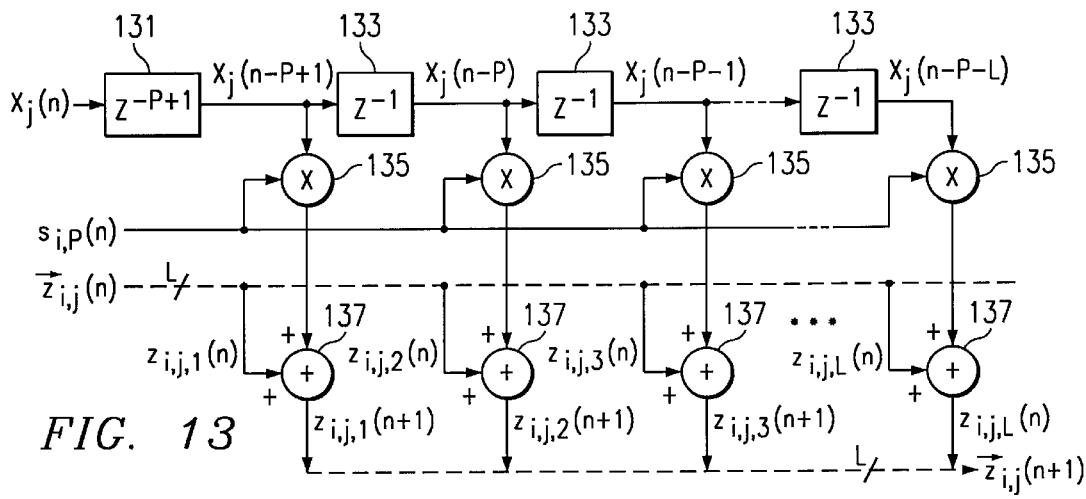
FIG. 13 illustrates update of $\vec{Z}_{i,j}(n)$.

FIG. 13 illustrates implementation of equation 4.30 at update of $\vec{Z}_{i,j}(n)$. The signal $X_j(n)$ is delayed by $Z^{p-1}$ by delay 131 and thereafter delayed by one cycle delay 133 and the successive delayed outputs are multiplied at multipliers by the signal $s_{i,p}(n)$ (the last element of the $s_{i,p}$ generator). The multiplied output is summed successively at adders 137 to $\vec{Z}_{i,j}(n)$.

Figure 14:
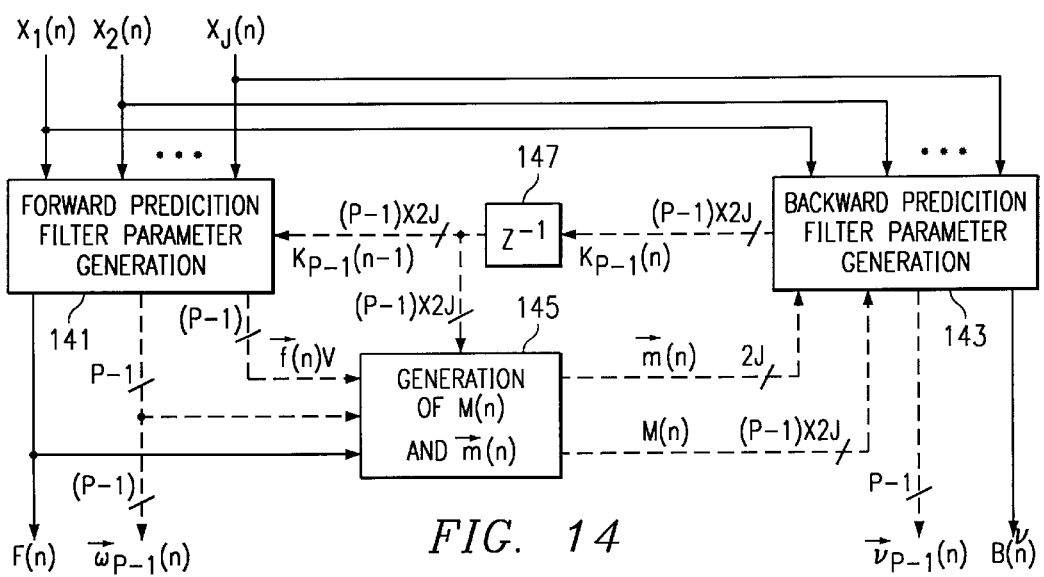
FIG. 14 illustrates forward and backward filter parameter generators.

FIG. 14 illustrates the forward and backward filter parameter generator 103 comprising both the forward prediction filter parameter generator 141 and backward prediction filter parameter generator 143. The generators 141 and 143 are coupled to receive the system inputs $X_1(n)$-$X_J(n)$. The forward prediction generator 141 is responsible to the input signals from each channel and a gain matrix from the backward prediction generator 143 to generate a single forward prediction filter vector $\vec{\omega}_{p-1}(n)$ signal and corresponding single forward prediction error F(n) signal and a-posteriori forward prediction error vector $\vec{f}(n)V$ for all channels. The single forward prediction filter vector $\vec{\omega}_{p-1}(n)$ and the corresponding single forward error F(n) and a-posteriori forward prediction error $\vec{f}(n)v$ are applied to M(n) and $\vec{m}(n)$ generator 145. The outputs M(n) and $\vec{m}(n)$ from generator 145 are applied to the backward prediction filter parameter generator 143. The backward prediction filter parameter generator 143 is responsive to the input signals from each channel and output M(n) and $\vec{m}(n)$to generate a single backward prediction filter vector $\vec{v}_{p-1}(n)$ and corresponding single backward prediction error B(n) for all channels and an updated gain matrix. The generator 143 gain matrix $k_{p-1}(n)$ is delayed one cycle by delay 147 to provide $k_{p-1}(n-1)$ to the generator of M(n) and $\vec{m}(n)$ and to the forward prediction filter parameter generator 141. The generator 103 implements equations 4.33 through 4.42.

Figure 15:
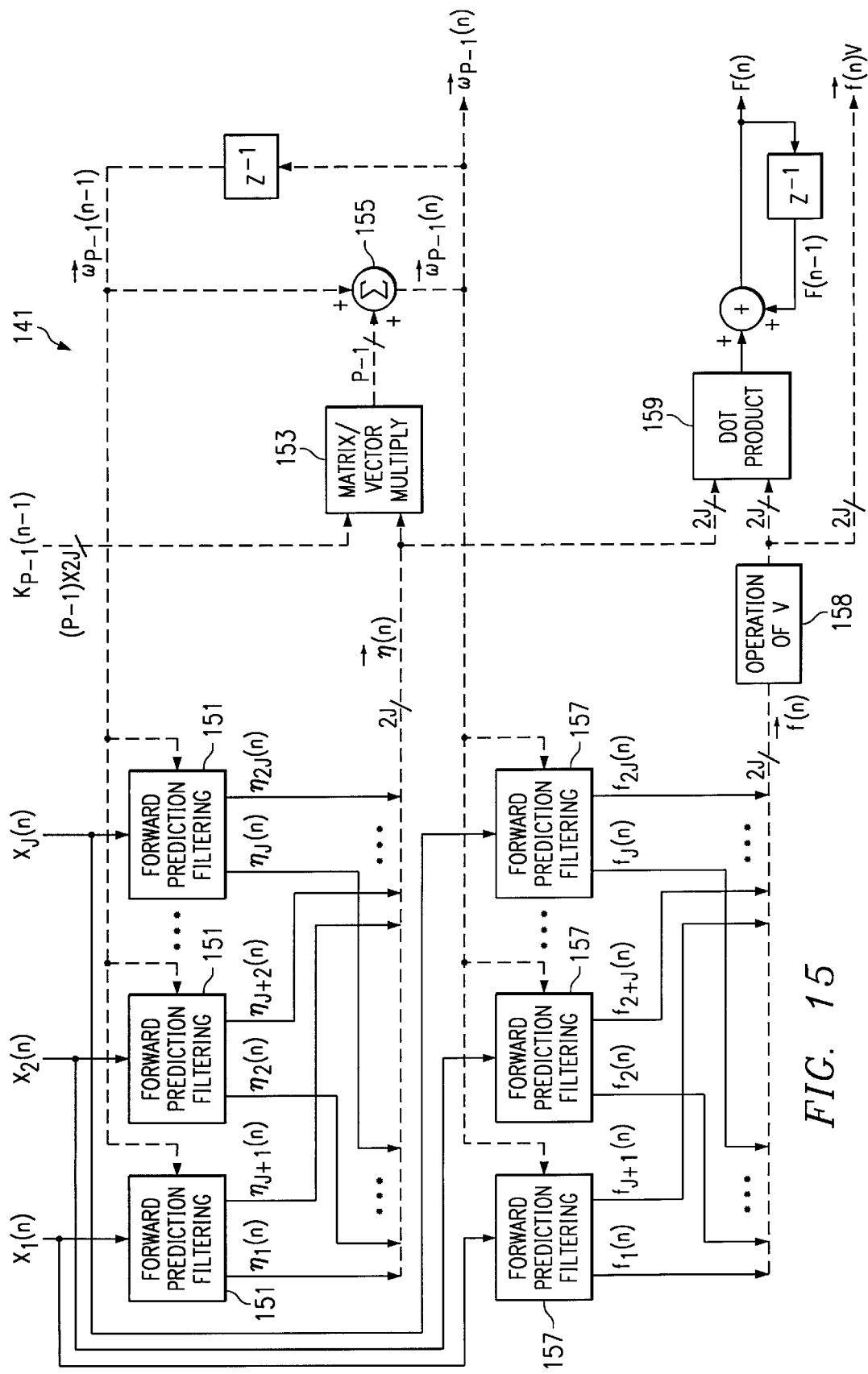
FIG. 15 illustrates forward prediction filter parameter generation.

FIG. 15 illustrates implementation of equations 4.33 through 4.36 in the forward prediction filter generator 141 to update the forward prediction filter parameters. The generator 141 includes the forward prediction filters 151 responsive to input channel signals $X_1(n)$-$X_J(n)$ and one cycle delayed forward prediction filter vector $\vec{\omega}_{p-1}(n-1)$. The forward prediction filtering produces a set of prediction error signals $\eta_1(n) \ldots \eta_{2J}(n)$ that are rearranged as shown in FIG. 15 to generate a vector signal $\vec{\eta}(n)$ that is input to matrix/vector multiplier 153. The first output of the J filters 151 is arranged sequentially followed by the second output of the same J filters is arranged sequentially. The other input of multiplier 153 is the delayed gain vector $k_{p-1}(n-1)$ from the backward prediction parameter generator 143. The output of multiplier 153 is added to the one cycle delayed forward prediction vector $\vec{\omega}_{p-1}(n-1)$ at summer 155 to produce the updated forward filter vector $\vec{\omega}_{p-1}(n)$. The vector signal $\vec{\omega}_{p-1}(n)$ is also applied to forward prediction filters 157 to produce another set of error signals that are rearranged as shown in FIG. 15 to produce the vector $\vec{f}(n)$ signal. This vector $\vec{f}(n)$ signal is applied to Operation of V 158 to produce vector $\vec{f}(n)V$ which is the a-posteriori forward prediction error vector signal. The output vector signals from the filters 151 and the a-posteriori prediction error vector are applied to DOT product 159 which outputs are summed with the previous cycle forward prediction error F(n) to produce the updated forward prediction error F(n).

Figure 16:
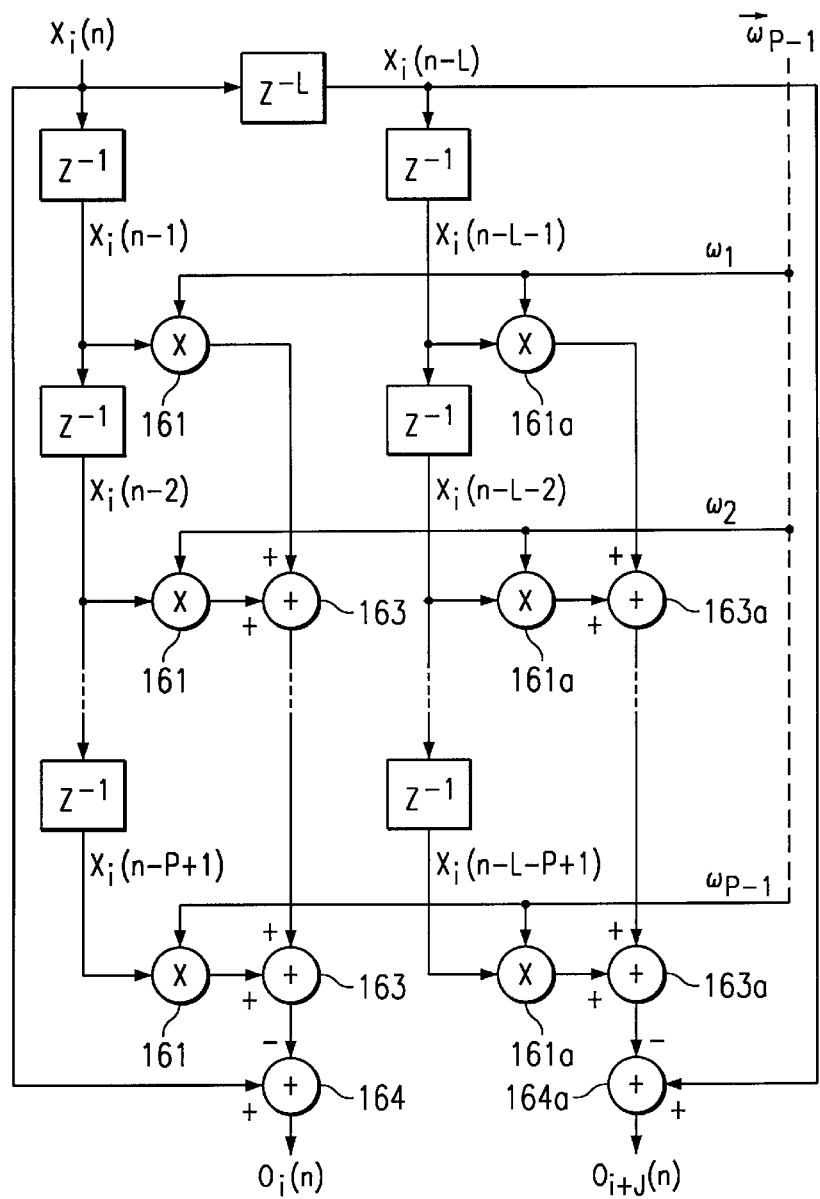
FIG. 16 illustrates forward prediction filtering.

FIG. 16 illustrates the forward prediction filtering responsive to the input $X_i(n)$ and delayed $X_i(n-L)$ and the forward prediction filtering vector $\vec{\omega}_{p-1}$ to produce two errors represented as $o_i(n)$ (first of each) and $o_{i+j}(n)$ (last ones). The input $X_i(n)$ is successively delayed by one clock cycle and multiplied by the forward predictors $\vec{\omega}_{p-1}$ at multipliers 161. All of the outputs of the multipliers 161 are summed at adders 163. The output of the adders 163 is subtracted from input $X_i(n)$ at adder 164 to produce the error $O_i(n)$. Similarly, the delay input $X_i(n-L)$ is successively delayed by one clock cycle and multiplied by forward prediction error $\vec{\omega}_{p-1}$ at multiplier 161a. All of the outputs of the multipliers 161a are summed at adders 163a. The output of the adders 163a is subtracted from the delayed input $X_i(n-L)$ at adder 164a to produce $O_{i+j}(n)$.

Figure 17:
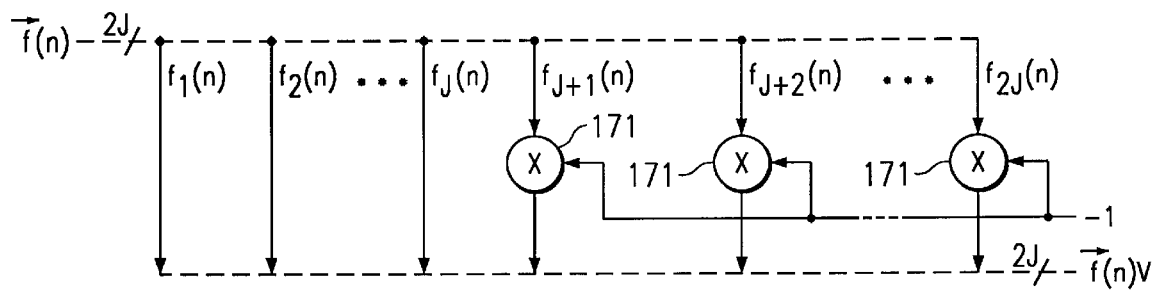
FIG. 17 illustrates Operation of V.

FIG. 17 illustrates how Operation of V is performed by multiplying last half of the input vector $\vec{f}(n)$ by −1 at multiplier 171 to produce signal $\vec{f}(n)V$.

Figure 18:
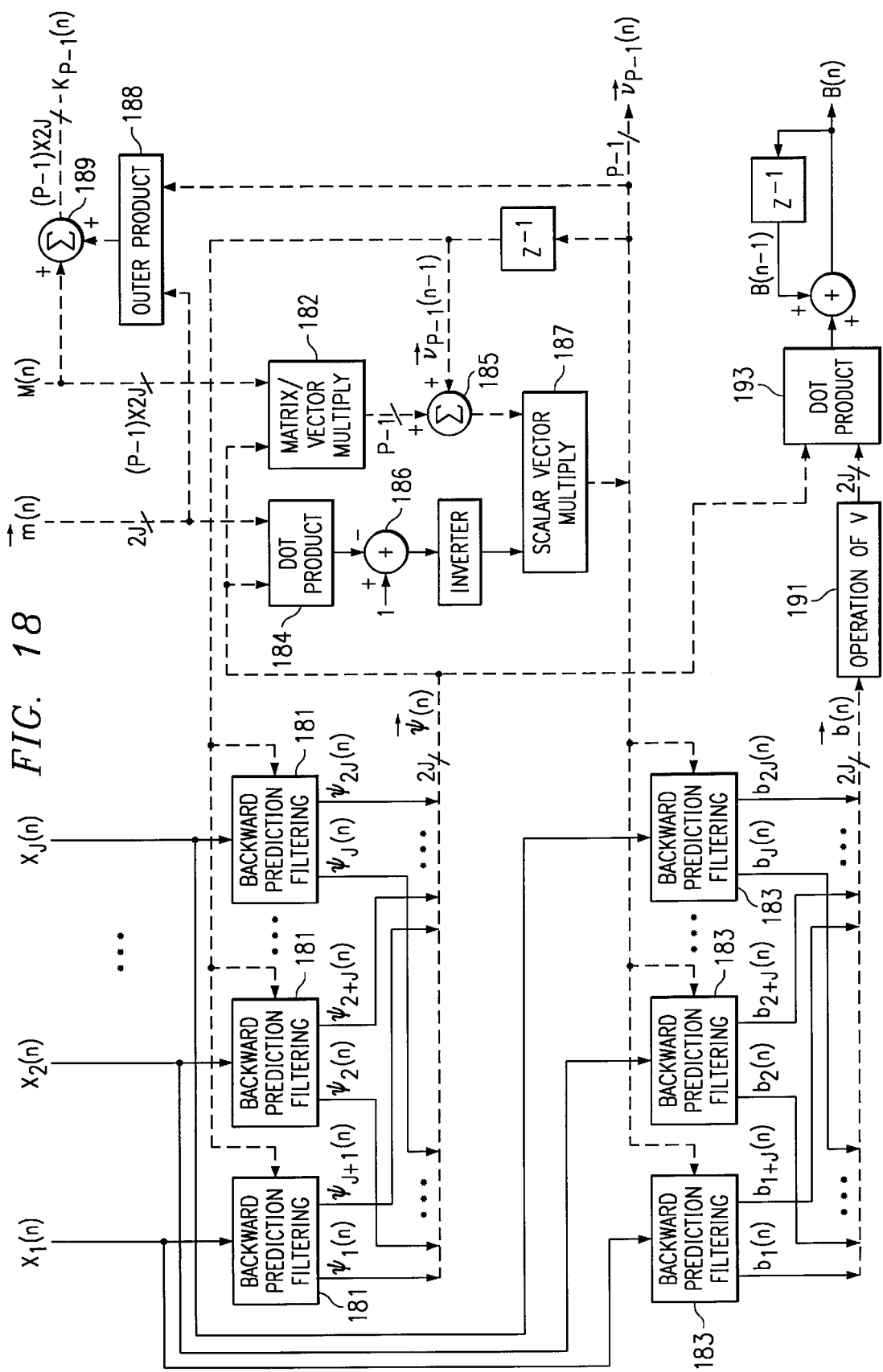
FIG. 18 illustrates backward prediction filter parameter generation.

The backward prediction filter parameter generator 143 implements equations 4.37, 4.38 then 4.42 as illustrated in FIG. 18. The inputs $X_1(n)$-$X_j(n)$ and one cycled delayed backward prediction filter vector $\vec{v}_{p-1}(n-1)$ are applied to backward prediction filters 181 to produce a set of errors that are rearranged as shown in FIG. 18 to generate a vector signal $\vec{\psi}(n)$. The first output of the J filters 181 is arranged sequentially followed by the second output of the same J filter 181 is arranged sequentially. The output vector $\vec{\psi}(n)$ from filters 181 are applied to DOT product 184 and matrix/vector multiplier 182. The DOT product 184 also receives $\vec{m}(n)$ and the result is subtracted from 1 at adder 186. The output of adder 186 is inverted and applied to scalar vector multiply 187. The (p−1) X2J dimensional matrix M(n) that is the output from generator 145 is multiplied by the vector $\vec{\psi}(n)$ in multiplier 182. The output from multiplier 182 is summed with the one cycle delayed backward prediction filter vector $\vec{v}_{p-1}(n-1)$ at summer 185 and that sum is applied to the scalar vector multiply 187 to produce the updated backward prediction filter vector $\vec{v}_{p-1}(n)$ signal. The backward prediction filter vector $\vec{v}_{p-1}(n)$ signal is multiplied by vector $\vec{m}(n)$ at the outer product 188. Outer product takes elements of the input vectors and multiplies them individually to produce a matrix output. The matrix output of outer product 188 is summed with M(n) at summer 189 to produce gain matrix of $k_{p-1}(n)$. The inputs $X_1(n)$-$X_j(n)$ and the updated backward prediction vector $\vec{v}_{p-1}(n)$ are applied to filter 183 to produce a set of errors that are rearranged as shown in FIG. 18 to generate $\vec{b}(n)$. The vector $\vec{b}(n)$ (2J lines) are applied to Operation of V 191 to multiply the last half of the vectors by −1 as illustrated in FIG. 17. The output of operation V 191 is applied with the vectors $\vec{\psi}(n)$ from filters 181 at DOT product 193. The output of DOT product 193 is summed with the one cycle delayed backward prediction error B(n) to produce the updated backward prediction error B(n).

Figure 19:
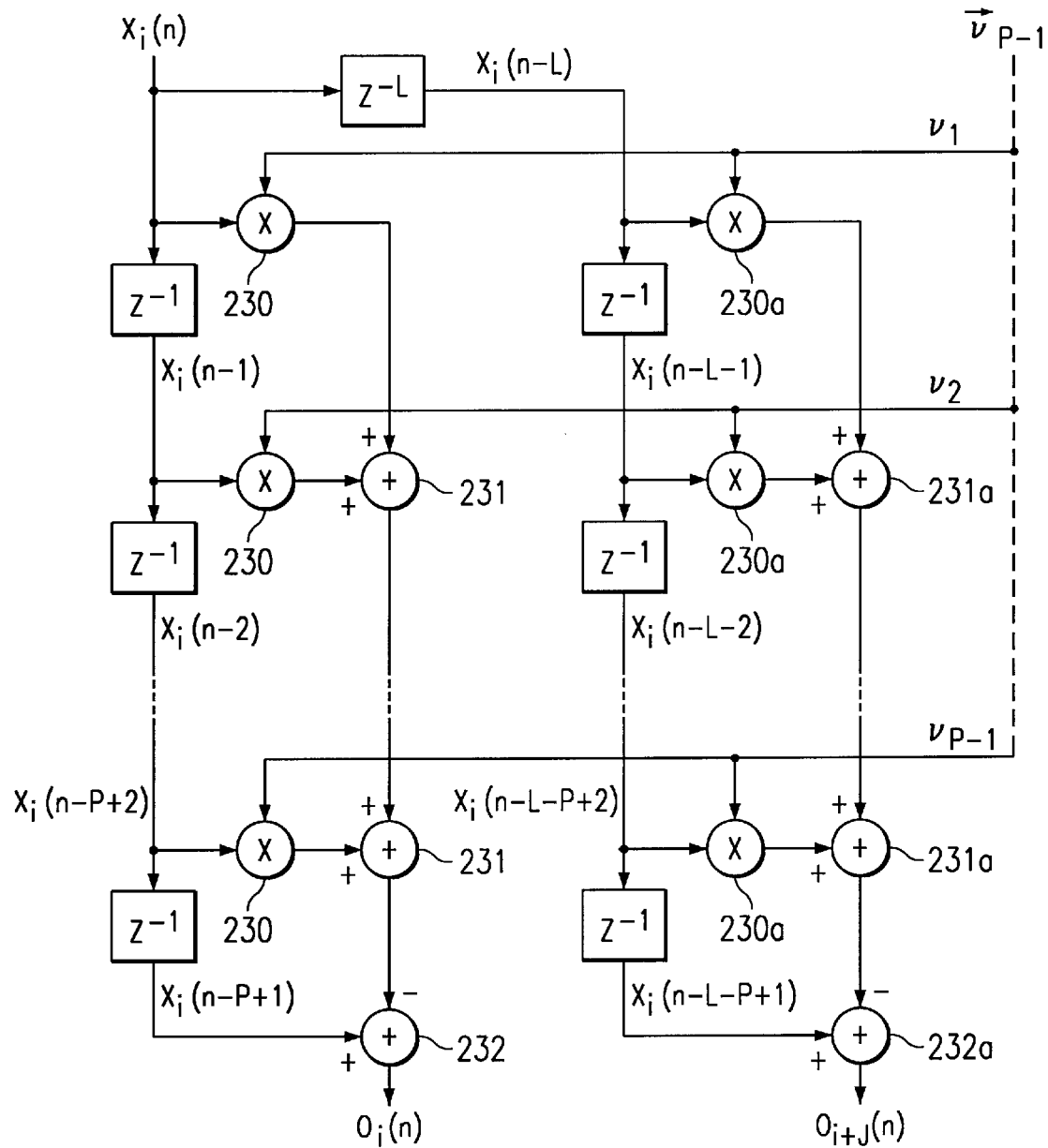
FIG. 19 illustrates backward prediction filtering.

FIG. 19 illustrates the backward prediction filtering responsive to input $x_i(n)$ and delayed $X_i(n-L)$ and the backward prediction filtering vector to produce two errors represented as $O_i(n)$ and $O_{i+j}(n)$. The input $X_i(n)$ is successively delayed by one clock cycle and multiplied by the backward predictor $\vec{v}_{p-1}$ at multipliers 230. All of the outputs of multipliers 230 are added at adders 231. The output of adders 231 is subtracted from the delayed input $X_i(n-p+1)$ at addler 232 to produce the error $O_i(n)$. Similarly, the delayed input $X_i(n-L)$ is successively delayed and multiplied by the backward filter vector $\vec{v}_{p-1}$ at multipliers 230a. All of the output of multipliers 230a are added at adders 231a. The output of adders 231a is subtracted from the delayed input $X_i(n-L-p+1)$ to produce the error output $O_{i+j}(n)$.

Figure 20:
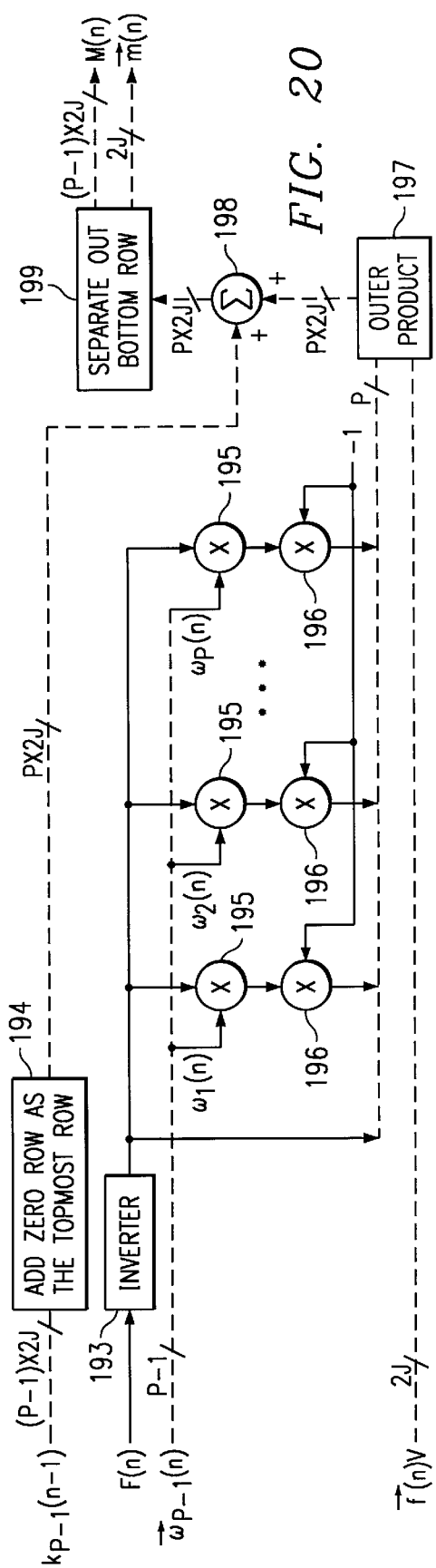
FIG. 20 illustrates generation of M(n) and $\vec{m}(n)$.

FIG. 20 illustrates the generation of M(n) and $\vec{m}(n)$. The inverted forward error F(n) is multiplied at multiplier 195 with the forward prediction filter vector $\vec{\omega}_{p-1}(n)$ and the result is multiplied by −1 at multiplier 196. The output from the multiplier 196 together with the inverted F(n) produces a p dimensional vector that is input to outer product 197. The other input to the outer product is the a-posteriori error vector $\vec{f}(n)V$ from generator 191. To the topmost row of $k_{p-}(n-1)$ is added a zero row and this is summed at summer 198 to the output of outer product 197 to produce when separating out the bottom row, the matrix M(n) and the vector $\vec{m}(n)$.

Figure 21:
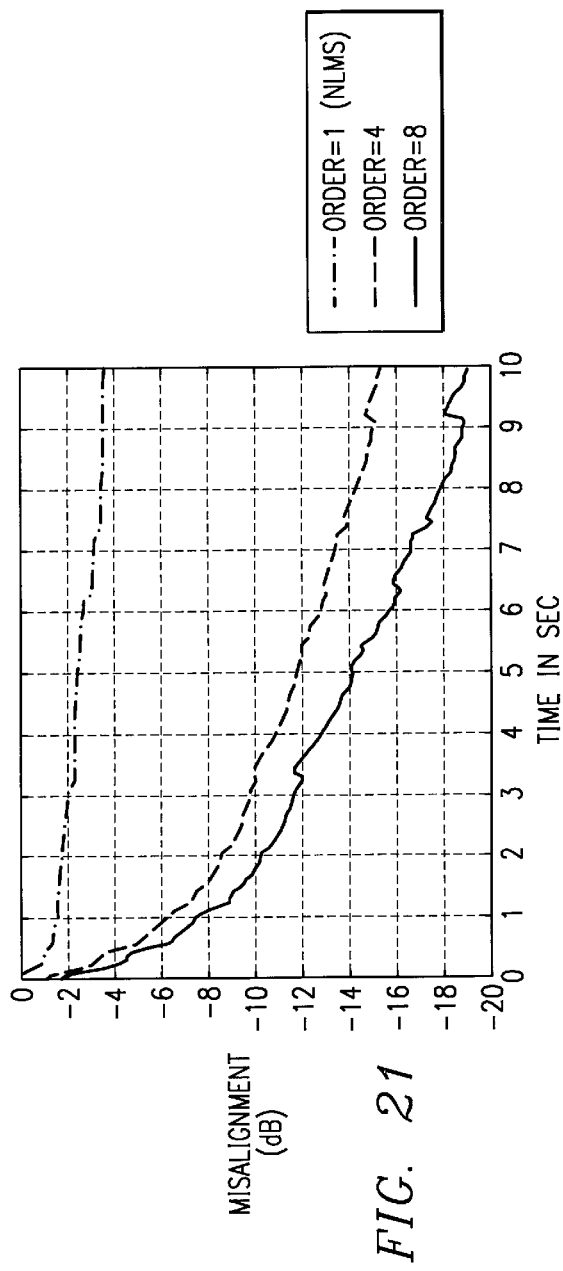
FIG. 21 illustrates behavior of misalignment with time for normalized LMS and the fast multi-channel affine projection technique for orders 4 and 8.

The simulation results for stereophonic acoustic echo cancellation in teleconferencing systems (a two-channel adaptive filtering system) like that disclosed in FIG. 1 follows. We collected stereo speech samples in our audio laboratory. The audio laboratory was used as the transmitting room. We had two speakers talking alternately in the room when two microphones were used to collect the data. The data were sampled at 16 kHz sampling rate. Since this stereo data is correlated, we used the technique in the system described in FIG. 1 and provisional application Ser. No. 09/076,575 filed Mar. 3, 1998 incorporated herein by reference. We simulated the receiving room loudspeaker outputs by convolving the stereo signals using the echo path responses $\hat{h}_{11}$ and $\hat{h}_{12}$. These two echo path responses were obtained using the image method of Allen et al. ("Image Method for Efficiently Simulating Small-Room Acoustics," J. Acoust. Soc. Am., Vol. 65, No.4, pp. 943–950, April 1979) based on room measurements of one of our conference rooms. The microphone output in the receiving room was simulated by summing up the outputs of these two convolutions. In the above convolutions, we restricted the lengths of the echo path responses to be N=4096 samples long. We then used the two adaptive filters $h_{11}$ and $h_{12}$ each of length L=2048 samples, to identify these echo path responses using the technique discussed in this paper. FIG. 5 shows the misalignment in dB with time for different projection order p=1 (NLMS), 4 and 8. The misalignment is defined as $$10*\log_{10} \frac{\|\hat{h}_{11,1:2048} - h_{11}\|_2^2 + \|\hat{h}_{12,1:2048} - h_{12}\|_2^2}{\|\hat{h}_{11,1:2048}\|_2^2 + \|\hat{h}_{12,1:2048}\|_2^2}$$

where, the subscript 1:2048 is used to indicate that the first 2048 samples of the corresponding echo path responses have been used here. The improvement of performance with increasing projection order (with only nominal increase in computational complexity) is clearly visible from FIG. 21.

In this application, we have described a novel fast technique for multi-channel adaptive filtering using the affine projection algorithms. The fast version is obtained by defining a new structure for multi-channel forward and backward predictors that allows fast inversion of the sum of auto-correlation matrices of the inputs of the different channels. The fast technique developed here allows fast convergence and lower mean squared error with little increase in computational complexity. Further, the trade-off between complexity and performance can be controlled by the parameter, 'projection order'. Because of computational complexity of the earlier techniques, a value of p greater than 4 is rarely used. The new technique would allow much higher value of p probably up to 64 in practical systems.

What is claimed is:

1. A multi-channel adaptive filter system for generating an estimated signal for each channel based on multi-channel signals $x_1(n)$-$x_J(n)$, the filter system comprising:

a forward and backward prediction filter generator responsive to said multi-channel signals $x_1(n)$-$x_J(n)$ for generating a single forward prediction filter vector $\vec{\omega}_{p-1}(n)$ and corresponding single forward error $F(n)$ for all channels and a single backward prediction filter vector $\vec{v}_{p-1}(n)$ and corresponding single backward error $B(n)$;

an error generator for each channel responsive to errors in the estimated signal for multiplying said errors by 1-$\mu$, where $\mu$ is an adaptation constant for generating error vectors for each channel;

a pre-filter signal generator for each channel coupled to said forward and backward prediction filter generator and said error generator and responsive to said single forward prediction filter vector $\vec{\omega}_{p-1}(n)$ and corresponding single forward error $F(n)$ and said single backward prediction filter vector $\vec{v}_{p-1}(n)$ and corresponding single backward error and said error vectors for each channel for generating pre-filtering coefficients; and an adaptive filter output generator coupled to said pre-filter generator and said multi-channel signals $x_1(n)$-$x_J(n)$ for generating an estimate signal for each channel.

2. The multi-channel adaptive filter of claim 1 wherein said pre-filtering coefficients are partitioned into two groups with a first group consisting of all except the last pre-filtering coefficients and a second group consisting of the last pre-filtering coefficients.

3. The multi-channel adaptive filter system of claim 1 wherein said forward and backward prediction filter generator comprises a forward prediction filter parameter generator and a separate backward prediction filter generator responsive to said input signals $X1(n)$-$XJ(n)$ from each channel and a gain matrix from said backward prediction filter generator for generating said single forward prediction filter vector $\omega_{p-1}(n)$ and corresponding forward error $F(n)$ and an a-posteriori error vector $\vec{f}(n)V$.

4. The multi-channel adaptive filter system of claim 3 wherein said backward prediction filter generator is responsive to said input signal, said single forward prediction vector $\vec{\omega}_{p-1}(n)$ and corresponding forward error $F(n)$ and an a-posteriori error vector for generating a single backward prediction filter vector $\vec{v}_{p-1}(n)$ and corresponding backward prediction error and an updated gain matrix.

5. In a communications system having a plurality of microphones at a transmitting location transmitting over separate corresponding plurality of channels to corresponding speakers in a receiving location and a plurality of microphones at the receiving location coupled over corresponding plurality of channels to speakers at the transmitting location generating echo signals, a multi-channel acoustic cancellation system comprising:

filter means coupled to output of said plurality of microphones at said transmitting location and input to said plurality of speakers at receiving location for providing estimated signals representing estimates of echo path responses from said plurality microphones from said receiving location to said plurality of speakers at said transmitting location; said filter means comprising:

a forward and backward prediction filter generator responsive to said multi-channel signals $x_1(n)$-$x_J(n)$ for generating a single forward prediction filter vector $\vec{\omega}_{p-1}(n)$ and corresponding single forward error $F(n)$ for all channels and a single backward prediction filter vector $\vec{v}_{p-1}(n)$ and corresponding single backward error $B(n)$;

an error generator for each channel responsive to errors in the estimated signal for multiplying said errors by 1-$\mu$, where $\mu$ is an adaptation constant for generating error vectors for each channel;

a pre-filter signal generator for each channel coupled to said forward and backward prediction filter generator and said error generator and responsive to said single forward prediction filter vector $\vec{\omega}_{p-1}(n)$ and corresponding single forward error $F(n)$ and said single backward prediction filter vector $\vec{v}_{p-1}(n)$ and corresponding single backward error and said error vectors for each channel for generating pre-filtering coefficients; and an adaptive filter output generator coupled to said pre-filter generator and said multi-channel signals $x_1(n)$-$x_J(n)$ for generating an echo estimate signal for each channel;

means coupled to input of said plurality of speakers at said transmitting location and output of said microphones at said receiving location for providing true signals representing true echo signal;

means for subtracting said true signals from said estimated signals to reduce echo signals and to obtain coefficient control signals representing errors; and means for coupling said coefficient control signals to said filter means to change the filter coefficients to minimize said errors.

6. The multi-channel adaptive filter system of claim 5 wherein said pre-filtering coefficients are partitioned into two groups with a final group consisting of all except the last pre-filtering coefficients and the second group consisting of the last pre-filtering coefficients.

7. The multi-channel adaptive filter system of claim 5 wherein said forward and backward prediction filter generator comprises a forward prediction filter parameter generator and a separate backward prediction filter generator that is responsive to said input signals $X1(n)$-$XJ(n)$ from each channel and a gain matrix from said backward prediction filter generator for generating said single forward prediction filter vector $\vec{\omega}_{p-1}(n)$ and corresponding single forward error $F(n)$ and an a-posteriori error vector $\vec{f}(n)V$.

8. The multi-channel adaptive filter system of claim 5 wherein said backward prediction filter generator is responsive to said input signal, said single forward prediction vector $\vec{\omega}_{p-1}(n)$ and corresponding forward error $F(n)$ and an a-posteriori error vector for generating a single backward prediction filter vector $\vec{v}_{p-1}(n)$ and corresponding backward prediction error and an updated gain matrix.

9. A communications system having a plurality of microphones at a transmitting location transmitting over separate corresponding plurality of channels to corresponding speakers in a receiving location and a plurality of microphones at the receiving location coupled over corresponding plurality of channels to speakers at the transmitting location generating echo signals, a multi-channel acoustic cancellation system comprising:

- filter means coupled to output of said plurality of microphones at said transmitting location and input to said plurality of speakers at receiving location for providing estimated signals representing estimates of echo path responses from said plurality microphones from said receiving location to said plurality of speakers at said transmitting location; said filter means comprising:
- a forward and backward prediction filter generator responsive to said multi-channel signals $x_1(n)$-$x_J(n)$ for generating a single forward prediction filter vector $\vec{\omega}_{p-1}(n)$ and corresponding single forward error $F(n)$ for all channels and a single backward prediction filter vector $\vec{v}_{p-1}(n)$ and corresponding single backward error $B(n)$;
- an error generator for each channel responsive to errors in the estimated signal for multiplying said errors by 1-$\mu$, where $\mu$ is an adaptation constant for generating error vectors for each channel;
- a pre-filter signal generator for each channel coupled to said forward and backward prediction filter generator and said error generator and responsive to said single forward prediction filter vector $\vec{\omega}_{p-1}(n)$ and corresponding single forward error $F(n)$ and said single backward prediction filter vector $\vec{v}_{p-1}(n)$ and corresponding single backward error and said error vectors for each channel for generating pre-filtering coefficients; and
- an adaptive filter output generator coupled to said pre-filter generator and said multi-channel signals $x_1(n)$-$x_J(n)$ for generating an echo estimate signal for each channel;
- means coupled to input of said plurality of speakers at said transmitting location and output of said microphones at said receiving location for providing true signals representing true echo signal;
- means for subtracting said true signals from said estimated signals to reduce echo signals and to obtain coefficient control signals representing errors; and
- means for coupling said coefficient control signals to said filter means to change the filter coefficients to minimize said errors.

* * * * *